United States Patent
Aiba et al.

(10) Patent No.: US 12,062,544 B2
(45) Date of Patent: Aug. 13, 2024

(54) LASER ANNEALING METHOD FOR SEMICONDUCTOR DEVICE, SEMICONDUCTOR DEVICE, LASER ANNEALING METHOD, CONTROL DEVICE OF LASER ANNEALING APPARATUS, AND LASER ANNEALING APPARATUS

(71) Applicants: SUMITOMO HEAVY INDUSTRIES, LTD., Tokyo (JP); FUJI ELECTRIC CO., LTD., Kanagawa (JP)

(72) Inventors: Takeshi Aiba, Kanagawa (JP); Hiroshi Takishita, Kanagawa (JP); Takashi Yoshimura, Kanagawa (JP)

(73) Assignees: SUMITOMO HEAVY INDUSTRIES, LTD., Tokyo (JP); FUJI ELECTRIC CO., LTD., Kanagawa (JP)

( * ) Notice: Subject to any disclaimer, the term of this patent is extended or adjusted under 35 U.S.C. 154(b) by 666 days.

(21) Appl. No.: 17/129,813

(22) Filed: Dec. 21, 2020

(65) Prior Publication Data

US 2021/0111026 A1 Apr. 15, 2021

Related U.S. Application Data

(63) Continuation of application No. PCT/JP2019/022650, filed on Jun. 6, 2019.

(30) Foreign Application Priority Data

Jun. 22, 2018 (JP) ................................. 2018-118611

(51) Int. Cl.
*H01L 21/32* (2006.01)
*B23K 26/03* (2006.01)
(Continued)

(52) U.S. Cl.
CPC .......... *H01L 21/268* (2013.01); *B23K 26/032* (2013.01); *B23K 26/32* (2013.01); *H01L 21/324* (2013.01); *B23K 2101/40* (2018.08)

(58) Field of Classification Search
CPC ... H01L 21/268; H01L 21/324; B23K 26/032; B23K 26/32; B23K 2101/40
(Continued)

(56) References Cited

U.S. PATENT DOCUMENTS 8,067,302 B2 11/2011 Li
8,460,975 B2 6/2013 Nakazawa et al.
(Continued)

FOREIGN PATENT DOCUMENTS

JP H09133928 A * 5/1997 ........... H01L 21/268
JP 2003-178982 A 6/2003
(Continued)

OTHER PUBLICATIONS

International Search Report issued in Application No. PCT/JP2019/022650, dated Aug. 27, 2019.
(Continued)

*Primary Examiner* — Phuc T Dang
(74) *Attorney, Agent, or Firm* — Michael Best & Friedrich LLP

(57) ABSTRACT

A laser annealing method for a semiconductor device, includes: a first step of adding an impurity to a semiconductor substrate; and a second step of irradiating a region to which the impurity is added with a pulsed laser beam a plurality of times to anneal the semiconductor substrate. In the second step, a first region of a portion of the region to which the impurity is added is irradiated with the pulsed laser beam, and after a predetermined time interval, a second region adjacent to the first region is irradiated with the
(Continued)

pulsed laser beam. The predetermined time interval is larger than a pulse interval of the pulsed laser beam.

9 Claims, 25 Drawing Sheets

(51) Int. Cl.
*B23K 26/32* (2014.01)
*H01L 21/268* (2006.01)
*H01L 21/324* (2006.01)
*B23K 101/40* (2006.01)

(58) Field of Classification Search
USPC .................................................. 438/463, 363
See application file for complete search history.

(56) References Cited

U.S. PATENT DOCUMENTS

| | | |
|---|---|---|
| 8,545,240 B2 | 10/2013 | Casher et al. |
| 8,802,580 B2 | 8/2014 | Im et al. |
| 8,809,130 B2 | 8/2014 | Nakazawa et al. |
| 9,418,852 B2 | 8/2016 | Nakazawa et al. |
| 2011/0269346 A1 | 11/2011 | Casher et al. |
| 2011/0309370 A1 | 12/2011 | Im et al. |

FOREIGN PATENT DOCUMENTS

| | | | | |
|---|---|---|---|---|
| JP | 2008026885 A | * | 2/2008 | ......... G01N 21/6458 |
| JP | 2011-187916 A | | 9/2011 | |
| JP | 2012-009603 A | | 1/2012 | |
| JP | 2012-503886 A | | 2/2012 | |
| JP | 2012023171 A | * | 2/2012 | |
| JP | 2012-044046 A | | 3/2012 | |
| JP | 2012044046 A | * | 3/2012 | |
| JP | 2012-508958 A | | 4/2012 | |
| JP | 2012-508985 A | | 4/2012 | |
| JP | 2013-058610 A | | 3/2013 | |
| JP | 2013-138252 A | | 7/2013 | |
| JP | 2014-192277 A | | 10/2014 | |
| JP | 2015-154000 A | | 8/2015 | |
| KR | 20170081604 A | * | 7/2017 | ......... B23K 26/0608 |
| WO | WO-2011096326 A1 | * | 8/2011 | ........... H01L 21/268 |

OTHER PUBLICATIONS

Office Action isued in Japanese Application No. 2020-519473, dated Dec. 22, 2020.

* cited by examiner

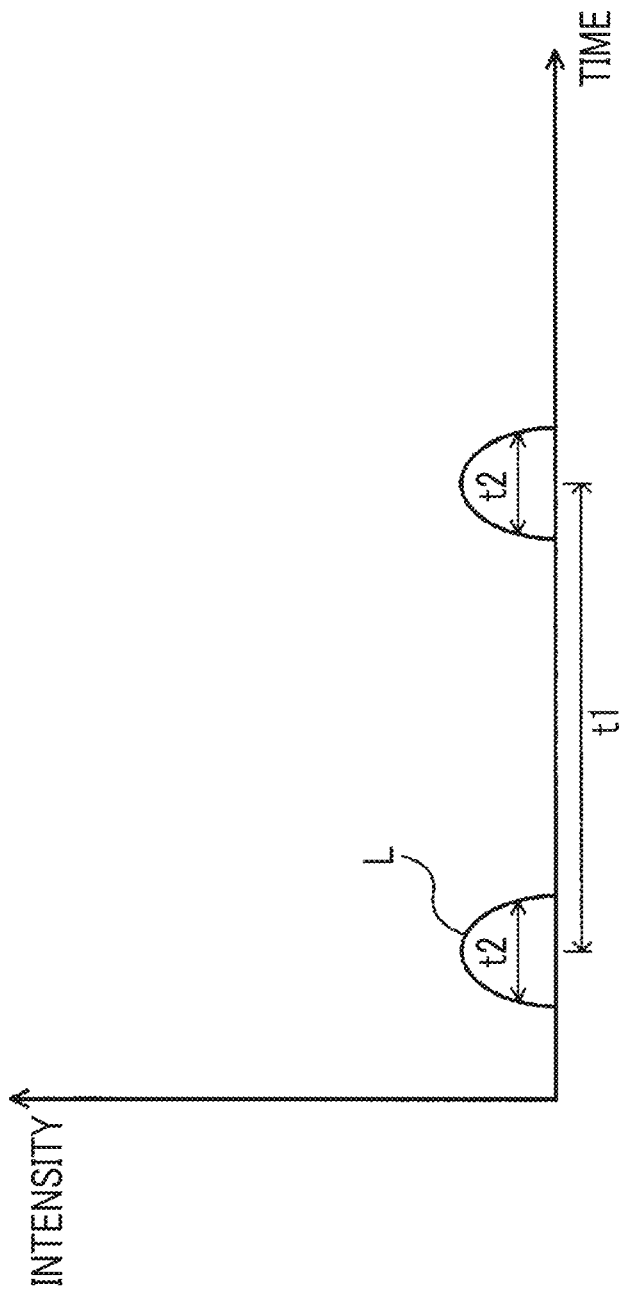

FIG. 8

| | OL RATIO | NUMBER OF shots | ENERGY DENSITY | PULSE WIDTH | FREQUENCY | ACTIVATION RATIO | EVALUATION RESULT |
|---|---|---|---|---|---|---|---|
| EXAMPLE 1 | -67% / 0% | 3 | 7.7 | 20 | 1.0 | 0.89 | UNACCEPTABLE |
| EXAMPLE 2 | -50% / 50% | 8 | 7.5 | 20 | 1.0 | 0.97 | ACCEPTABLE |
| EXAMPLE 3 | -67% / 50% | 6 | 7.7 | 20 | 1.2 | 0.97 | ACCEPTABLE |
| EXAMPLE 4 | -67% / 50% | 6 | 8.5 | 25 | 1.2 | 1.00 | ACCEPTABLE |
| EXAMPLE 5 | -50% / 50% | 4 | 7.5 | 20 | 1.0 | 0.93 | ACCEPTABLE |
| COMPARATIVE EXAMPLE | 67% / 50% | 6 | 6.1 | 20 | 1.0 | 1.00 | UNACCEPTABLE |

FIG. 15A

| NUMBER OF SHOTS | PULSE ENERGY DENSITY (J/cm²) | MAXIMUM TEMPERATURE REACHED AT EACH DEPTH (K) | | | | | | |
|---|---|---|---|---|---|---|---|---|
| | | SURFACE | 1 μm | 2 μm | 3 μm | 4 μm | 5 μm | 10 μm | BACK SURFACE |
| 1 | 6.8 | 1679 | 1625 | 1526 | 1436 | 1356 | 1286 | 1029 | 510 |
| 2 | 5.7 | 1680 | 1634 | 1550 | 1473 | 1404 | 1342 | 1113 | 629 |
| 3 | 5.1 | 1682 | 1648 | 1576 | 1506 | 1443 | 1386 | 1173 | 716 |
| TEMPERATURE DIFFERENCE BETWEEN TWO-SHOT IRRADIATION AND ONE-SHOT IRRADIATION | | 1 | 10 | 25 | 37 | 47 | 56 | 84 | 119 |
| TEMPERATURE DIFFERENCE BETWEEN THREE-SHOT IRRADIATION AND ONE-SHOT IRRADIATION | | 3 | 23 | 50 | 70 | 86 | 100 | 144 | 206 |

LASER ANNEALING METHOD FOR SEMICONDUCTOR DEVICE, SEMICONDUCTOR DEVICE, LASER ANNEALING METHOD, CONTROL DEVICE OF LASER ANNEALING APPARATUS, AND LASER ANNEALING APPARATUS

RELATED APPLICATIONS

The contents of Japanese Patent Application No. 2018-118611, and of International Patent Application No. PCT/JP2019/022650, on the basis of each of which priority benefits are claimed in an accompanying application data sheet, are in their entirety incorporated herein by reference.

BACKGROUND

Technical Field

Certain embodiments of the present invention relate to a laser annealing method for a semiconductor device, a semiconductor device, a laser annealing method, a control device of a laser annealing apparatus, and a laser annealing apparatus.

Description of Related Art

In the related art, when a semiconductor device is produced (manufactured), an annealing heat treatment for the purpose of activating an ion-implanted layer formed on a semiconductor substrate (semiconductor wafer) is performed by a laser annealing treatment using a temperature rise due to laser irradiation energy.

In addition, in order to activate the ions implanted into a deep region, infrared (IR) laser annealing using a wavelength in the infrared region (for example, 808 nm) is performed. Since it is not possible to irradiate the entire surface of the semiconductor substrate with a single laser irradiation, a plurality of shots are repeatedly performed. At this time, an overlap ratio is set for a laser annealing apparatus, and one shot of the laser is shifted little by little to continuously perform laser irradiation on the same point a plurality of times.

FIG. 19 is a top view illustrating an irradiation image in a laser annealing method in the related art. FIG. 19 is an example in a case where the overlap ratio is set to 50%/50%. The overlap ratio is a main parameter of the laser annealing apparatus that indicates a ratio at which an irradiation region overlaps in a scan direction (y-axis direction) and a ratio at which an irradiation region overlaps in a step direction (x-axis direction). The case of 50%/50% indicates 50% overlap in the scan direction and 50% overlap in the step direction. Here, the first 50% is the overlap ratio in the scan direction, and the next 50% is the overlap ratio in the step direction.

In FIG. 19, the y-axis direction is called the scan direction and the x-axis direction is called the step direction. In FIG. 19, an irradiation region L shows one shot of the laser. In addition, in FIG. 19, each region of the semiconductor substrate is indicated by a rectangle, and hereinafter, the region of a specific rectangle is represented by coordinates. For example, in FIG. 19, on the leftmost side (the negative direction of an x-axis), the uppermost region (the negative direction of a y-axis) is represented by a (0,0) region, the right side (the positive direction of the x-axis) of the (0,0) region is represented by a (1,0) region, and the lower side (the positive direction of the y-axis) of the (0,0) region is represented by a (0,1) region.

First, as illustrated in (a) of FIG. 19, the laser irradiates the (0,0) region and the (0,1) region. Next, as illustrated in (b) of FIG. 19, the laser is moved downward in the scan direction (the positive direction of the y-axis) and irradiates the (0,1) region and a (0,2) region. In this way, 50% of the irradiated region in (a) of FIG. 19 is irradiated again. Thereafter, similarly, as illustrated in (c) to (f) of FIG. 19, the laser is moved downward in the scan direction and performs laser irradiation to irradiate 50% of the irradiated region again.

Next, after irradiating a (0,5) region and a (0,6) region at an end portion of the semiconductor substrate as illustrated in (f) of FIG. 19, the laser is moved to the right side in the step direction (the positive direction of the x-axis) and irradiates the half of the (0,5) region and the (0,6) region and the half of a (1,5) region and a (1,6) region as illustrated in (g) of FIG. 19. Thereafter, as illustrated in (h) of FIG. 19, the laser is moved upward in the scan direction (the negative direction of the y-axis) and irradiates the half of a (0,4) region and the (0,5) region, and the half of a (1,4) region and the (1,5) region. Thereafter, similarly, as illustrated in (i) to (l) of FIG. 19, the laser irradiation is performed in the scan direction to irradiate 50% of the irradiated region again.

As described above, with 50% overlap in the scan direction and 50% overlap in the step direction, at an overlap ratio of 50%/50%, one region is irradiated with the laser four times except for an outer peripheral portion of the regions on which the laser irradiation is performed.

The overlap ratio can also be set to 67%/50%, 67%/67%, or the like. In the case of 67%, ⅔ of a part overlaps, and the number of laser irradiations of one region increases. For example, in the case of an overlap ratio of 67%/50%, one region is irradiated with the laser six times except for the outer peripheral portion of the regions on which the laser irradiation is performed.

By continuously performing the laser irradiation on the same point a plurality of times in this way, the temperature of a target rises, heat accumulates in the semiconductor substrate, and activation of impurities implanted by ions is promoted. Accordingly, crystal defects generated by ion implantation are recovered, and an n-type or p-type active layer is formed by activation of the impurities.

In order to perform high-quality annealing, an annealing method is known in which a plurality of laser pulses are incident on a semiconductor substrate to which impurities are added so that regions on which any two laser pulses having a continuous incidence sequence are incident do not have overlapping parts.

In addition, a laser annealing method that enables effective impurity activation of an insulated gate bipolar transistor (IGBT) to a sufficient depth is known. In this laser annealing method, a laser pulse in which a rise time to rise from 10% to 90% of a maximum intensity of a pulse waveform is 160 ns or longer and the ratio of the rise time to a fall time to fall from 90% to 10% of the maximum intensity of the pulse waveform is larger than one is used. While scanning this laser pulse, a semiconductor wafer is repeatedly irradiated to perform a heat treatment on the semiconductor wafer so that the treated layer is maintained in an unmelted state while the semiconductor wafer remains unmelted or only the surface layer is melted and the treated layer except for the surface layer is maintained in an unmelted state. In this method, the light penetration length of the pulsed laser can be lengthened, and activation up to a target deep region (for example, 2 μm or more) is possible.

SUMMARY

According to an embodiment of the present invention, there is provided a laser annealing method for a semiconductor device, including: a first step of adding an impurity to a semiconductor substrate; and a second step of irradiating a region to which the impurity is added with a pulsed laser beam a plurality of times to anneal the semiconductor substrate. In the second step, a first region of a portion of the region to which the impurity is added is irradiated with the pulsed laser beam, and after a predetermined time interval, a second region adjacent to the first region is irradiated with the pulsed laser beam.

According to another embodiment of the present invention, there is provided a semiconductor device including: a second conductive type first semiconductor layer provided on a front surface of a first conductive type semiconductor substrate; a first conductive type first semiconductor region selectively provided on a surface layer of the first semiconductor layer opposite to a semiconductor substrate side; a first conductive type second semiconductor layer having a higher impurity concentration than the semiconductor substrate, which is selectively provided on a surface layer of the semiconductor substrate opposite to the first semiconductor layer; a gate electrode provided on at least a portion of a surface of the first semiconductor layer interposed between the first semiconductor region and the semiconductor substrate via a gate insulating film; a first electrode provided on the first semiconductor region and the surface of the first semiconductor layer; and a second electrode provided on a surface of the second semiconductor layer, in which the semiconductor layer is formed by annealing the semiconductor substrate by adding an impurity to the semiconductor substrate, irradiating a first region of a portion of a region to which the impurity is added with a pulsed laser beam, and after a predetermined time interval, irradiating a second region adjacent to the first region with the pulsed laser beam.

According to still another embodiment of the present invention, there is provided a laser annealing method of annealing an annealing object by repeating a unit step of scanning a surface of the annealing object with a pulsed laser beam a plurality of times so that regions on which the pulsed laser beam is incident do not overlap between shots, the method including: scanning the surface of the annealing object so that a region on which the pulsed laser beam is incident in one unit step and a region on which the pulsed laser beam is incident in another unit step partially overlap.

According to still another embodiment of the present invention, there is provided a control device of a laser annealing apparatus that scans a surface of an annealing object with a pulsed laser beam. The control device has a function of annealing the annealing object by repeating a unit step of scanning the surface of the annealing object with the pulsed laser beam a plurality of times so that regions on which the pulsed laser beam is incident do not overlap between shots, and a function of scanning the surface of the annealing object so that a region on which the pulsed laser beam is incident in one unit step and a region on which the pulsed laser beam is incident in another unit step partially overlap.

According to still another embodiment of the present invention, there is provided a laser annealing apparatus including: a laser light source that outputs a pulsed laser beam; a scanning mechanism that scans a surface of an annealing object held at a position on which the pulsed laser beam output from the laser light source is incident with the pulsed laser beam output from the laser light source; and a control device that controls the laser light source and the scanning mechanism. The control device controls the laser light source and the scanning mechanism, and has a function of annealing the annealing object by repeating a unit step of scanning the surface of the annealing object with the pulsed laser beam output from the laser light source a plurality of times so that regions on which the pulsed laser beam is incident do not overlap between shots, and a function of scanning the surface of the annealing object so that a region on which the pulsed laser beam is incident in one unit step and a region on which the pulsed laser beam is incident in another unit step partially overlap.

BRIEF DESCRIPTION OF THE DRAWINGS

FIG. 6 is a graph showing a laser pulse of a laser annealing apparatus according to the embodiment.

FIG. 8 is a table showing overlap ratios and evaluation results of examples and a comparative example.

FIG. 15A is a chart showing simulation results of a maximum temperature reached at positions of the upper surface, depths of 1 μm, 2 μm, 3 μm, 4 μm, 5 μm, and 10 μm, and the back surface of an annealing object.

DETAILED DESCRIPTION

However, an infrared laser (hereinafter, referred to as an IR laser) that activates ions in a deep region is set to have a high energy density. For example, the energy density is set to be about 3 to 6 times higher than that of a green laser that activates ions in a surface region. Therefore, silicon (Si) crystals generate a large amount of heat, and the heat generated on the surface of the semiconductor wafer irradiated by the laser irradiation is transferred to a non-irradiated surface on the opposite side, resulting in an increase in the temperature of the non-irradiated surface. Usually, an element structure is formed on the non-irradiated surface of the semiconductor wafer, and a protective film such as a protective tape is attached to the non-irradiated surface in order to protect the element structure.

The protective film and an adhesive usually have only heat resistance of about 200° C. to 300° C. When the non-irradiated surface rises in temperature above the heat resistant temperature, there are cases where the protective film may foam or deteriorate. As a result, it becomes difficult to remove the protective film from the semiconductor wafer in removing the protective film. In addition, the protective film is damaged. For example, in a case where the protective film is a resist, burning of the resist, transfer of the resist to a stage side, and the like occur. In a case where the protective film is a tape or glass reinforcement, there is concern about deterioration and deformation of a reinforcing agent and residues of the adhesive (glue).

Figure 20:
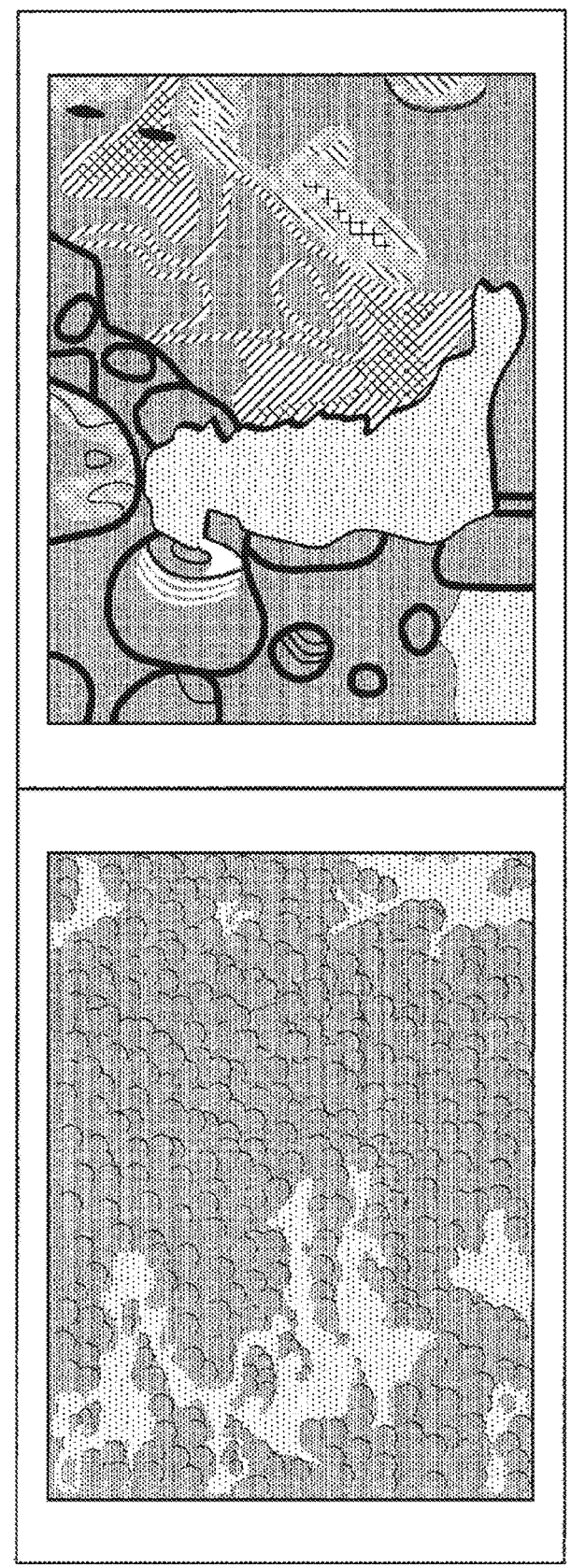
FIG. 20 is a top view showing a resist state after laser irradiation by the laser annealing method in the related art.

FIG. 20 is a top view showing a resist state after laser irradiation by the laser annealing method in the related art. This figure shows the results after performing the laser annealing method with an energy density of the IR laser of 5.4 J/cm², an overlap ratio of 67%/50%, and a pulse width of 20 us and a frequency of 1 kHz of the IR laser. In FIG. 20, the lower figure shows the resist state at a magnification of 5 times, and the upper figure shows the resist state at a magnification of 50 times. As shown in FIG. 20, in the laser annealing method in the related art, heat is transferred to the surface protective film on the non-irradiated surface, the temperature rises and exceeds the heat resistant temperature of the protective film, and the protective film is damaged. Due to the damage of the protective film, the surface of the semiconductor device cannot be protected, the manufacturing of the semiconductor device cannot proceed, and a defective product is produced.

It is desirable to provide a laser annealing method for a semiconductor device, a semiconductor device, a laser annealing method, a control device of a laser annealing apparatus, and a laser annealing apparatus capable of sufficiently annealing a surface layer portion on an irradiated surface side without damaging a protective film by suppressing heat generation on a non-irradiated surface side on which the protective film is provided.

In the laser annealing method for a semiconductor device according to this invention, in the above-described invention, the predetermined time interval is larger than a pulse interval of the pulsed laser beam.

In the laser annealing method for a semiconductor device according to this invention, in the above-described invention, in the annealing of the semiconductor substrate, irradiation regions continuously irradiated with the pulsed laser beam are separated by a predetermined interval or more.

In the laser annealing method for a semiconductor device according to this invention, in the above-described invention, the predetermined interval is more than 0% and not more than 100% of a width or height of the irradiation region.

In the laser annealing method for a semiconductor device according to this invention, in the above-described invention, the predetermined interval is ½ or ⅔ of a height of the irradiation region or the height of the irradiation region.

The laser annealing method for a semiconductor device according to this invention, in the above-described invention, further includes: forming a protective film on one surface of the semiconductor substrate before the annealing of the semiconductor substrate, in which, in the annealing of the semiconductor substrate, the pulsed laser beam is irradiated from a surface opposite to the surface on which the protective film is formed.

In the laser annealing method according to this invention, in the above-described invention, each of the unit steps includes moving the region on which the pulsed laser beam is incident in one direction at equal intervals for each shot.

In the laser annealing method according to this invention, in the above-described invention, an annealing target region to be annealed is defined on the surface of the annealing object, and a plurality of the unit steps are repeated so that regions on which a part having a light intensity of 90% or more of a maximum value in a beam cross section of the pulsed laser beam is incident completely cover the annealing target region.

In the control device of a laser annealing apparatus according to this invention, in the above-described invention, the control device further has a function of moving the region on which the pulsed laser beam is incident in one direction at equal intervals for each shot in each of the unit steps.

In the control device of a laser annealing apparatus according to this invention, in the above-described invention, an annealing target region to be annealed is defined on the surface of the annealing object, and the control device further has a function of repeating a plurality of the unit steps so that regions on which a part having a light intensity of 90% or more of a maximum value in a beam cross section of the pulsed laser beam is incident completely cover the annealing target region.

According to the above-described inventions, in the laser annealing method for a semiconductor device, the overlap ratio is set to be less than 0%. Accordingly, there is a time interval between the irradiation of a certain region with the laser and the irradiation of the adjacent region with the laser, and there is a time for the increased heat of a semiconductor wafer to decrease. Therefore, heat generation on the non-irradiated surface side can be suppressed. Therefore, when a deep region is activated by IR laser annealing, the semiconductor device does not become defective without damaging the protective film.

With the laser annealing method for a semiconductor device, the semiconductor device, the laser annealing method, the control device of a laser annealing apparatus, and the laser annealing apparatus according to the present invention, by suppressing heat generation on the non-irradiated surface side on which the protective film is provided, an effect of sufficiently annealing a surface layer portion on an irradiated surface side without damaging the protective film can be exhibited.

Hereinafter, preferred embodiments of a laser annealing method for a semiconductor device, a semiconductor device, a control device of a laser annealing apparatus, and a laser annealing apparatus according to the present invention will be described in detail with reference to the accompanying drawings. In the present specification and the accompanying drawings, layers and regions marked with n and p respectively mean electrons and holes as a large number of carriers. Further, + and − attached to n and p respectively mean a higher impurity concentration and a lower impurity concentration than those of layers and regions with no attachment. In the following description of the embodiment and the accompanying drawings, like configurations are denoted by like reference numerals, and redundant descriptions will be omitted.

Embodiment

Figure 1:
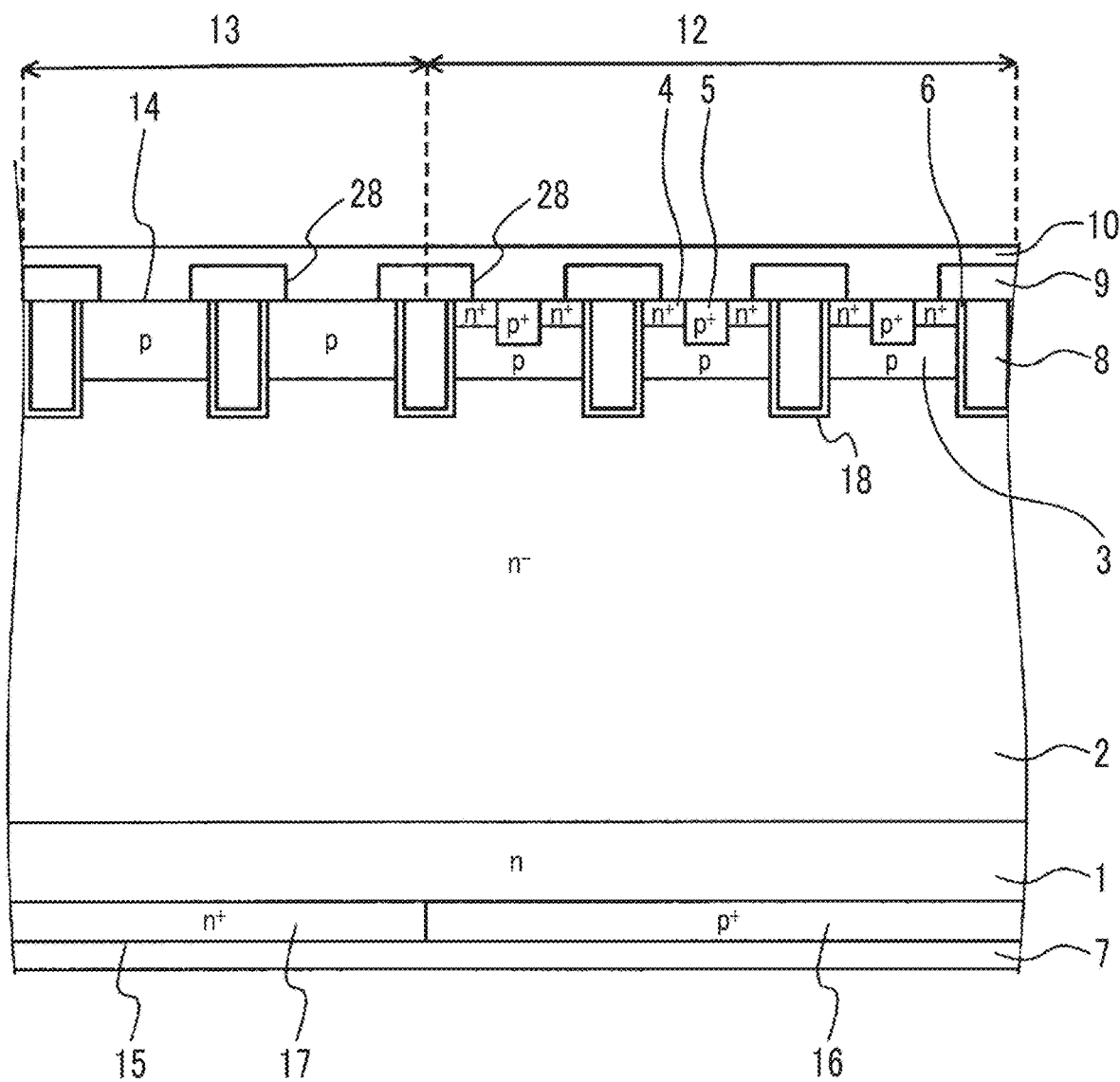
FIG. 1 is a cross-sectional view illustrating the structure of a semiconductor device according to an embodiment.

The laser annealing method for a semiconductor device according to the embodiment will be described by taking a method of manufacturing a reverse conducting IGBT (RC-IGBT) as the semiconductor device as an example. The RC-IGBT is formed by integrating, for example, an IGBT having a trench gate structure and a free wheeling diode (FWD) connected antiparallel to the IGBT on the same semiconductor substrate (semiconductor chip). FIG. 1 is a cross-sectional view illustrating the structure of the semiconductor device according to the embodiment. Specifically, in an active region on the same semiconductor substrate, an IGBT region 12 which is to be an IGBT operating region and an FWD region 13 which is to be an FWD operating region are provided in parallel. The active region is a region through which a current flows in an ON state. A pressure resistant structure such as a guard ring or a field plate may be provided in an edge termination region (not illustrating) surrounding the periphery of the active region.

Figure 2:
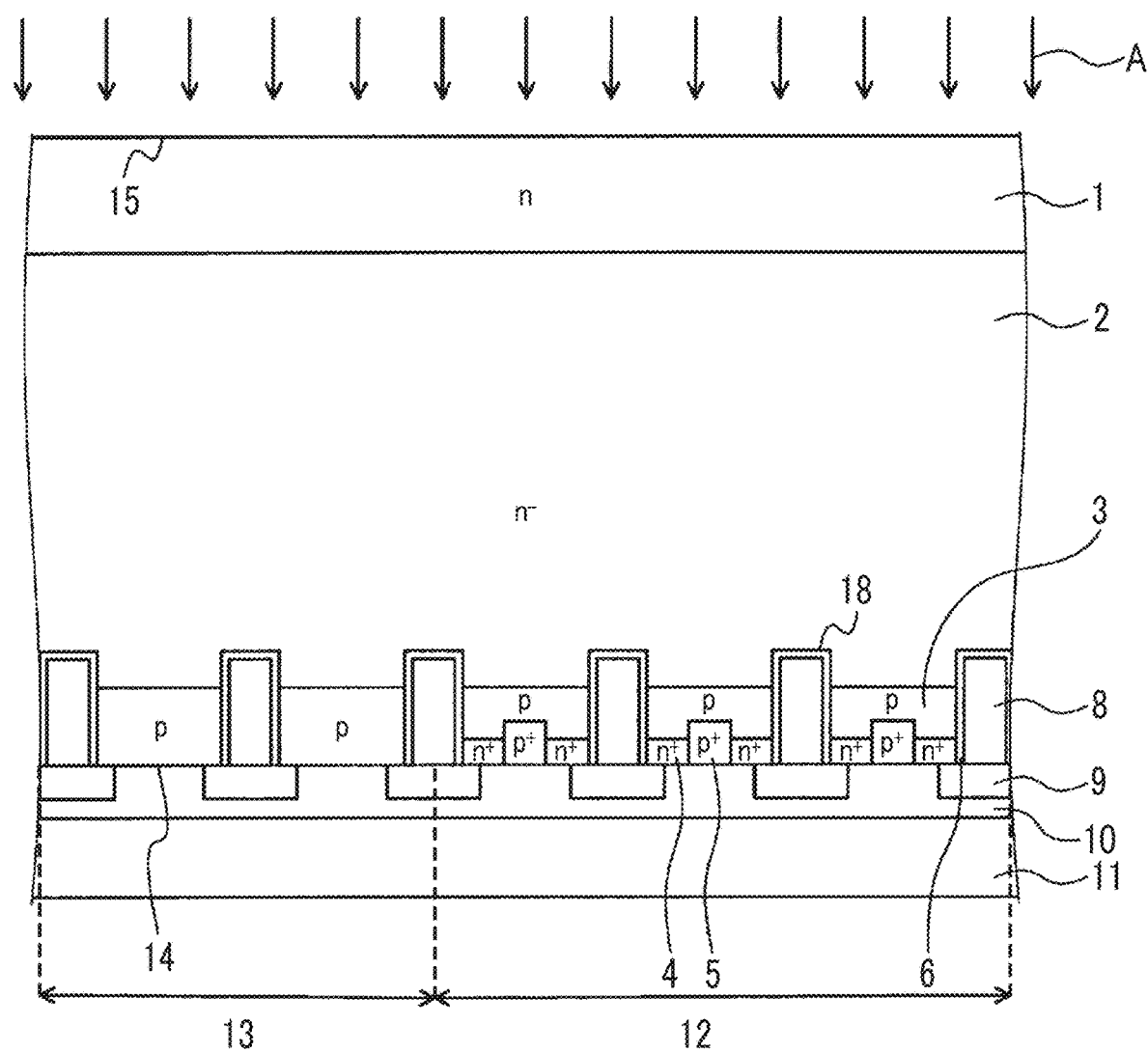
FIG. 2 is a cross-sectional view illustrating a manufacturing process of the semiconductor device according to the embodiment.

FIG. 2 is a cross-sectional view illustrating a manufacturing process of the semiconductor device according to the embodiment. An ion implantation process (step S4) for forming an n-type field stop (FS) layer 1 on a back surface 15 side of the semiconductor wafer, which will be described later, is illustrated.

Figure 3:
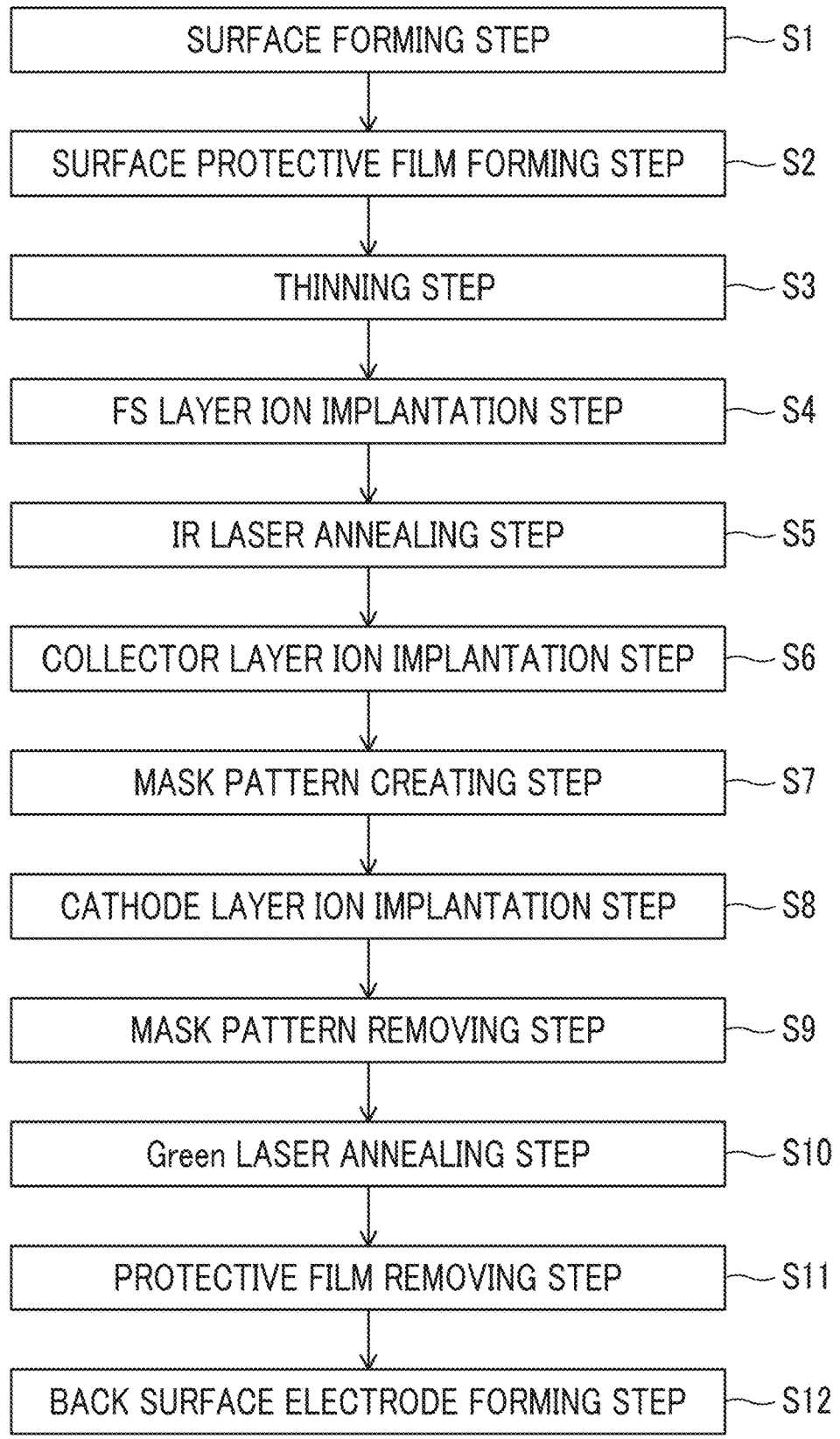
FIG. 3 is a flowchart showing a method of manufacturing the semiconductor device according to the embodiment.

FIG. 3 is a flowchart showing a method of manufacturing the semiconductor device according to the embodiment. In FIG. 3, processes regarding the laser annealing method of the present invention are described in detail. First, a process of forming the surface of the semiconductor device is performed (step S1). In this process, first, an n⁻-type semiconductor wafer which is to be an n⁻-type drift region 2 is prepared. A material of the semiconductor wafer may be silicon (Si) or silicon carbide (SiC). Next, processes of photolithography and ion implantation as a set are repeatedly performed under different conditions to form a p-type base region 3, an n⁺-type emitter region 4, and a p⁺-type contact region 5 of the IGBT on a front surface 14 side of the semiconductor wafer. The p-type base region 3 is formed over the entire surface of the active region from the IGBT region 12 to the FWD region 13. The p-type base region 3 also serves as a p-type anode region in the FWD region 13. The n$^+$-type emitter region 4 and the p$^+$-type contact region 5 are selectively formed inside the p-type base region 3 in the IGBT region 12.

Next, the front surface 14 of the semiconductor wafer is thermally oxidized to form a field oxide film covering the front surface 14 of the semiconductor wafer in the edge termination region. Next, by photolithography and etching, trenches 18 that penetrate the n$^+$-type emitter region 4 and the p-type base region 3 and reach the n$^-$-type drift region 2 are s formed in the IGBT region 12. For example, the trenches 18 are arranged in a striped layout extending in a direction (depth direction in FIG. 1) orthogonal to a direction (horizontal direction in FIG. 1) in which the IGBT region 12 and the FWD region 13 are aligned when viewed from the front surface 14 side of the semiconductor wafer.

The trenches 18 are also formed in the FWD region 13 in the same layout as the IGBT region 12. In the FWD region 13, the trenches 18 penetrate the p-type base region 3 (p-type anode region) and reach the n$^-$-type drift region 2. Next, a gate insulating film 6 is formed along the inner wall of the trench 18 by, for example, thermal oxidation. Next, a polysilicon (poly-Si) layer is formed on the front surface 14 of the semiconductor wafer so as to bury the inside of the trench 18. Next, for example, the polysilicon layer is etched back to leave a portion to be a gate electrode 8 inside the trench 18.

The p-type base region 3, the n$^+$-type emitter region 4, the p$^+$-type contact region 5, the trenches 18, the gate insulating film 6, and the gate electrode 8 constitute a MOS gate having a trench gate structure. The n$^+$-type emitter region 4 and the p$^+$-type contact region 5 may be formed after the formation of the gate electrode 8. The n$^+$-type emitter region 4 may be disposed in at least one mesa region between adjacent trenches 18 (mesa region), and there may be a mesa region in which the n$^+$-type emitter region 4 is not disposed. Further, the n$^+$-type emitter regions 4 may be selectively disposed at predetermined intervals in the direction in which the trenches 18 extend in a striped manner.

Next, an interlayer insulating film 9 is formed on the front surface 14 of the semiconductor wafer so as to cover the gate electrode 8. Next, the interlayer insulating film 9 is patterned to form a plurality of contact holes 28 penetrating the interlayer insulating film 9 in a depth direction. The depth direction is a direction from the front surface 14 to the back surface 15 of the semiconductor wafer. The n$^+$-type emitter region 4 and the p$^+$-type contact region 5 are exposed to the contact hole 28 of the IGBT region 12. The p-type base region 3 is exposed to the contact hole 28 of the FWD region 13.

Next, a surface electrode 10 is formed on the interlayer insulating film 9. A barrier metal film (not illustrated) may be formed along the inner wall of the contact hole 28, and a tungsten film may be buried to form a tungsten plug (not illustrated).

Next, a process of forming a protective film 11 on the surface is performed (step S2). The protective film 11 that protects the surface of the semiconductor device is formed on the surface electrode 10 with, for example, a resist, a tape, or glass. Next, the semiconductor wafer is ground from the back surface 15 side (back grind), and a thinning process of grinding the semiconductor wafer to the position of a product thickness used as the semiconductor device is performed (step S3). Next, by repeatedly performing the processes of photolithography and ion implantation as a set under different conditions, an ion implantation process for forming an n-type field stop (FS) layer 1 on the back surface 15 side of the semiconductor wafer is performed (step S4). For example, as indicated by arrow A in FIG. 2, n-type ions, such as phosphorus (P), are implanted.

Figure 4:
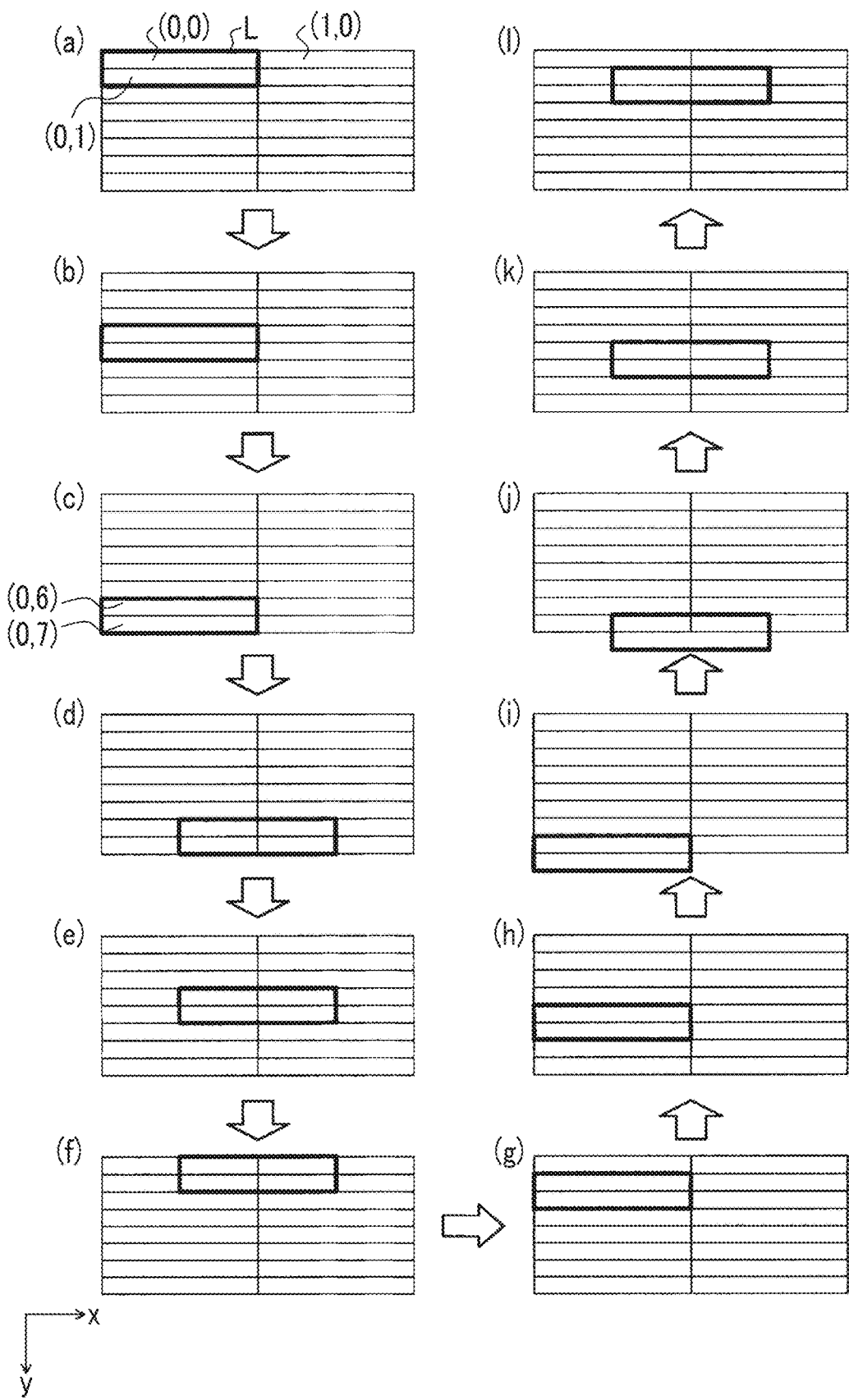
FIG. 4 is a top view showing an irradiation image in a laser annealing method according to the embodiment (first).
Figure 5:
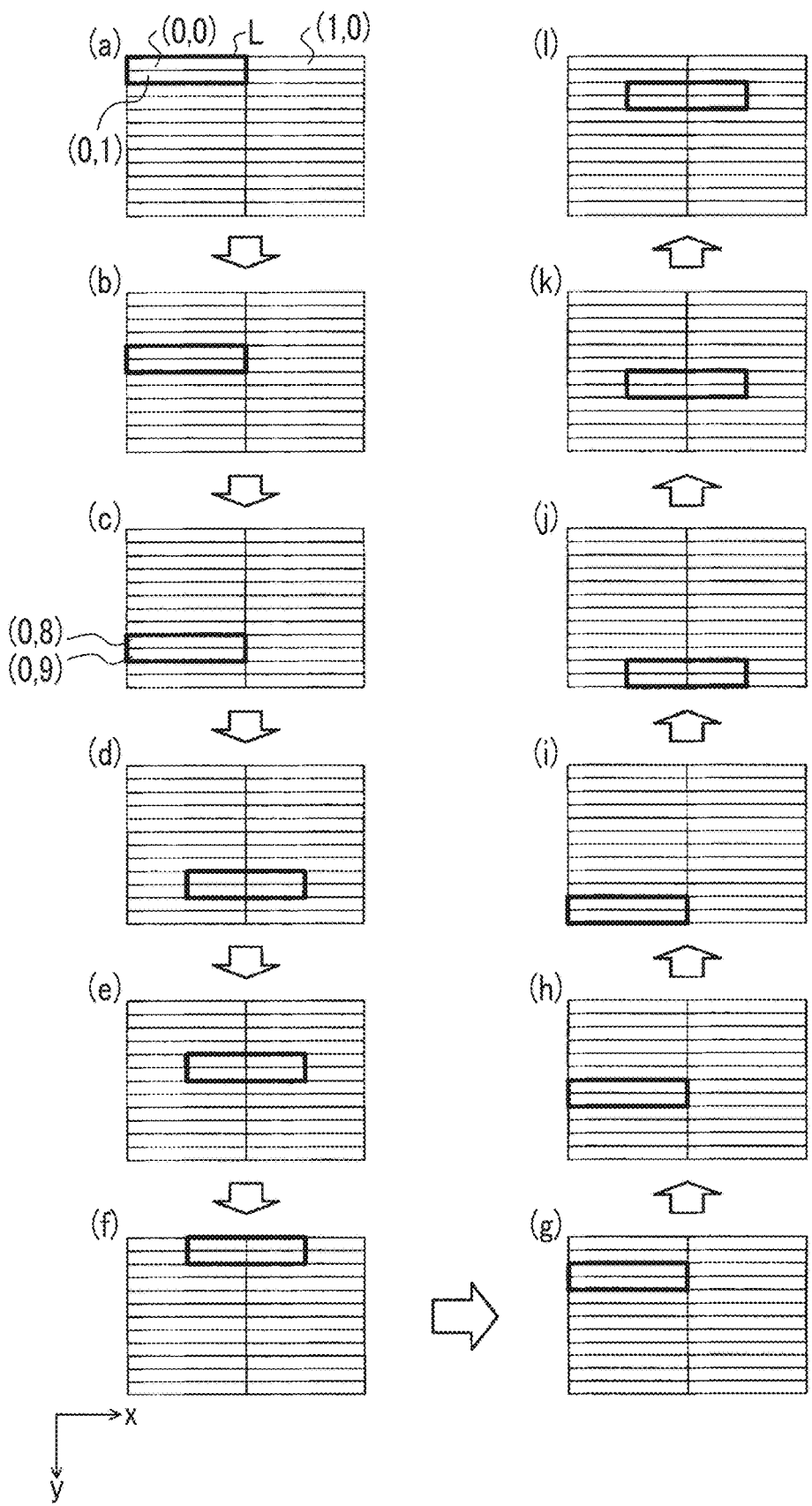
FIG. 5 is a top view showing an irradiation image in the laser annealing method according to the embodiment (second).

Next, an IR laser annealing process of activating the ions implanted into the n-type FS layer is performed (step S5). Here, FIGS. 4 and 5 are top views showing irradiation images in the laser annealing method according to the embodiment. FIG. 4 shows an example in a case where an overlap ratio is set to −50%/50%, and FIG. 5 shows an example in a case where an overlap ratio is set to −100%/50%. Also in FIGS. 4 and 5, a y-axis direction is called a scan direction, an x-axis direction is called a step direction, and an irradiation region L indicates one shot of a laser. Furthermore, also in FIGS. 4 and 5, each region of the semiconductor substrate is indicated by a rectangle, and the region of a specific rectangle is represented by coordinates. In the embodiment, the irradiation region L has, for example, a rectangular shape having a width (x-axis direction) of 2.5 mm and a height (y-axis direction) of 0.25 mm.

First, a case where the overlap ratio is −50%/50% in FIG. 4 will be described. First, as illustrated in (a) of FIG. 4, the laser irradiates a (0,0) region and a (0,1) region. Next, as illustrated in (b) of FIG. 4, the laser is moved downward in the scan direction (the positive direction of a y-axis) and irradiates a (0,3) region and a (0,4) region. As described above, the laser does not irradiate a (0,2) region and the laser irradiates a region separated from the region irradiated in (a) of FIG. 4 by 50% of the height of the region irradiated in (a) of FIG. 4. Thereafter, similarly, as illustrated in (c) of FIG. 4, the laser is moved downward in the scan direction from the irradiated region to a region separated by 50% of the height of the irradiated region and performs irradiation.

Next, after irradiating a (0,6) region and a (0,7) region at an end portion of the semiconductor substrate as illustrated in (c) of FIG. 4, the laser is moved to the right side in the step direction (the positive direction of an x-axis) and irradiates the half of the (0,6) region and the (0,7) region and the half of a (1,6) region and a (1,7) region as illustrated in (d) of FIG. 4. Thereafter, as illustrated in (e) of FIG. 4, the laser is moved upward in the scan direction (the negative direction of the y-axis) and irradiates the half of the (0,3) region and the (0,4) region, and the half of a (1,3) region and a (1,4) region. Thereafter, similarly, as illustrated in (f) of FIG. 4, the laser is moved upward in the scan direction from the irradiated region to a region separated by 50% of the height of the irradiated region and performs irradiation.

Next, after irradiating the half of the (0,0) region and the (0,1) region at the end portion of the semiconductor substrate and the half of a (1,0) region and a (1,1) region as illustrated in (f) of FIG. 4, the laser is moved to the left side in the step direction to irradiate the (0,2) region and the like that had not been overlapped and irradiated. As illustrated in (g) of FIG. 4, the laser irradiates the (0,1) region and the (0,2) region. Thereafter, as illustrated in (h) of FIG. 4, the laser is moved downward in the scan direction and irradiates the (0,4) region and a (0,5) region. Thereafter, similarly, as illustrated in (i) of FIG. 4, the laser is moved downward in the scan direction from the irradiated region to a region separated by 50% of the height of the irradiated region and performs irradiation.

Next, after irradiating the (0,7) region at the end portion of the semiconductor substrate as illustrated in (i) of FIG. 4, the laser is moved to the right side in the step direction and irradiates the half of the (0,7) region and the half of the (1,7)

region as illustrated in (j) of FIG. 4. Thereafter, as illustrated in (k) of FIG. 4, the laser is moved upward in the scan direction, and irradiates the half of the (0,4) region and the (0,5) region, and the half of the (1,4) region and a (1,5) region. Thereafter, similarly, as illustrated in (l) of FIG. 4, the laser is moved upward in the scan direction from the irradiated region to a region separated by 50% of the height of the irradiated region and performs irradiation.

As described above, since the laser is separated from the irradiated region by 50% in the scan direction and is overlapped by 50% in the step direction, the overlap ratio is −50%/50%. Here, the first −50% is the overlap ratio in the scan direction, and the next 50% is the overlap ratio in the step direction. In a case where the overlap ratio is −50%/50%, one region is irradiated with the laser four times except for the peripheral portion.

Next, a case where the overlap ratio is −100%/50% in FIG. 4 will be described. First, as illustrated in (a) of FIG. 5, the laser irradiates a (0,0) region and a (0,1) region. Next, as illustrated in (b) of FIG. 5, the laser is moved downward in the scan direction (the positive direction of the y-axis) and irradiates a (0,4) region and a (0,5) region. As described above, the laser does not irradiate a (0,2) region and a (0,3) region and the laser irradiates a region separated from the region irradiated in (a) of FIG. 5 by 100% of the height of the region irradiated in (a) of FIG. 5. Thereafter, similarly, as illustrated in (c) of FIG. 5, the laser is moved downward in the scan direction from the irradiated region to a region separated by 100% of the height of the irradiated region and performs irradiation.

Next, after irradiating a (0,8) region and a (0,9) region at the end portion of the semiconductor substrate as illustrated in (c) of FIG. 5, the laser is moved to the right side in the step direction (the positive direction of the x-axis) and irradiates the half of the (0,8) region and the (0,9) region and the half of a (1,8) region and a (1,9) region as illustrated in (d) of FIG. 5. Thereafter, as illustrated in (e) of FIG. 5, the laser is moved upward in the scan direction (the negative direction of the y-axis) and irradiates the half of the (0,4) region and the (0,5) region, and the half of a (1,4) region and a (1,5) region. Thereafter, similarly, as illustrated in (f) of FIG. 5, the laser is moved upward in the scan direction from the irradiated region to a region separated by 100% of the height of the irradiated region and performs irradiation.

Next, after irradiating the half of the (0,0) region and the (0,1) region at the end portion of the semiconductor substrate and the half of a (1,0) region and a (1,1) region as illustrated in (f) of FIG. 5, the laser is moved to the left side in the step direction to irradiate the (0,2) region, the (0,3) region, and the like that had not been overlapped and irradiated. As illustrated in (g) of FIG. 5, the laser irradiates the (0,2) region and the (0,3) region. Thereafter, as illustrated in (h) of FIG. 5, the laser is moved downward in the scan direction and irradiates a (0,6) region and a (0,7) region. Thereafter, similarly, as illustrated in (i) of FIG. 5, the laser is moved downward in the scan direction from the irradiated region to a region separated by 100% of the height of the irradiated region and performs irradiation.

Next, after irradiating a (0,10) region and a (0,11) region at the end portion of the semiconductor substrate as illustrated in (i) of FIG. 5, the laser is moved to the right side in the step direction and irradiates the half of the (0,10) region and the (0,11) region and the half of a (1,10) region and a (1,11) region as illustrated in (j) of FIG. 5. Thereafter, as illustrated in (k) of FIG. 5, the laser is moved upward in the scan direction and irradiates the half of the (0,6) region and the (0,7) region and the half of a (1,6) region, and a (1,7) region. Thereafter, similarly, as illustrated in (l) of FIG. 5, the laser is moved upward in the scan direction from the irradiated region to a region separated by 100% of the height of the irradiated region and performs irradiation.

As described above, since the laser is separated from the irradiated region by 100% in the scan direction and is overlapped by 50% in the step direction, the overlap ratio is −100%/50%. Here, the first −100% is the overlap ratio in the scan direction, and the next 50% is the overlap ratio in the step direction. In a case where the overlap ratio is −100%/50%, one region is irradiated with the laser two times except for the peripheral portion.

Although the cases where the overlap ratio of the present invention is −50%/50% and −100%/50% have been described, other overlap ratios, for example, −67%/50% can also be used. More generally, in the present invention, it is preferable that the overlap ratio in the scan direction is less than 0% and −100% or more (−100%≤overlap ratio<0%). That is, it is preferable that a region to be irradiated with the laser is separated from the region irradiated with the laser immediately therebefore by a distance greater than 0% of the height of this region and not more than 100% of the height of this region. Furthermore, the overlap ratio in the step direction can be set to other than 50%, and may be set to, for example, 0%.

Alternatively, the overlap ratio in the step direction can also be set to a negative overlap ratio. Even in this case, the overlap ratio is preferably less than 0% and −100% or more (−100%≤overlap ratio<0%). The overlap ratios in both the step direction and the scan direction can also be negative overlap ratios. In both cases, the overlap ratio is preferably less than 0% and −100% or more (−100%≤overlap ratio<0%).

By setting the overlap ratio in the scan direction to less than 0%, there is a time interval between the irradiation of a certain region with the laser and the irradiation of the adjacent region with the laser, and there is a time for the increased heat of the semiconductor wafer to decrease. Accordingly, heat generation on a non-irradiated surface side can be suppressed. Therefore, when a deep region is activated by IR laser annealing, the semiconductor device does not become defective without damaging the protective film. Furthermore, it is possible to prevent a deep region from being insufficiently heated and being unable to be activated due to an excessive increase in the interval between the regions subjected to the laser irradiation due to an overlap ratio set to −100% or more.

In the scan direction, the interval at which the laser is irradiated is a pulse interval of the laser, but in the embodiment, the laser irradiation is not continuously performed on the regions adjacent in the scan direction. Therefore, the time interval is larger than the laser pulse interval.

As illustrated in (c) and (d) in FIG. 4, at the end portion of the semiconductor wafer, although the half of the (0,6) region and the half of the (0,7) region are continuously irradiated with the laser and there is no interval between the regions, there is a time interval as described below.

FIG. 6 is a graph showing a laser pulse of the laser annealing apparatus according to the embodiment. In FIG. 6, the vertical axis represents the intensity of the laser pulse and the horizontal axis represents time. As shown in FIG. 6, in the laser annealing apparatus, a laser pulse L having a pulse width t2 is generated at a predetermined interval t1. The laser pulse L irradiates the semiconductor wafer and moves in the scan direction during an interval t1, and the next laser pulse L irradiates the semiconductor wafer. As described above, although the laser pulse L is continuously irradiated in the scan direction, since the movement in the step direction takes time, the laser pulse L is not continuously irradiated in the step direction. The pulse width t2 is a half width of the laser pulse L. The predetermined interval t1 is, for example, 1 ms, and the pulse width t2 is, for example, 20 μs.

Furthermore, in a laser annealing apparatus in which the movement in the step direction is the same as the movement in the scan direction, a time for reducing heat may be provided by increasing the time for the movement in the step direction. The end portion of the semiconductor wafer may be an invalid area that is not used for the semiconductor device. In this case, since the protective film is not provided at the end portion, there is no problem even if the temperature rises. In addition, for example, as illustrated in FIG. 7B described below, even at the end portion of the semiconductor wafer, an interval can be provided between the regions continuously irradiated with the laser.

Figure 7A:
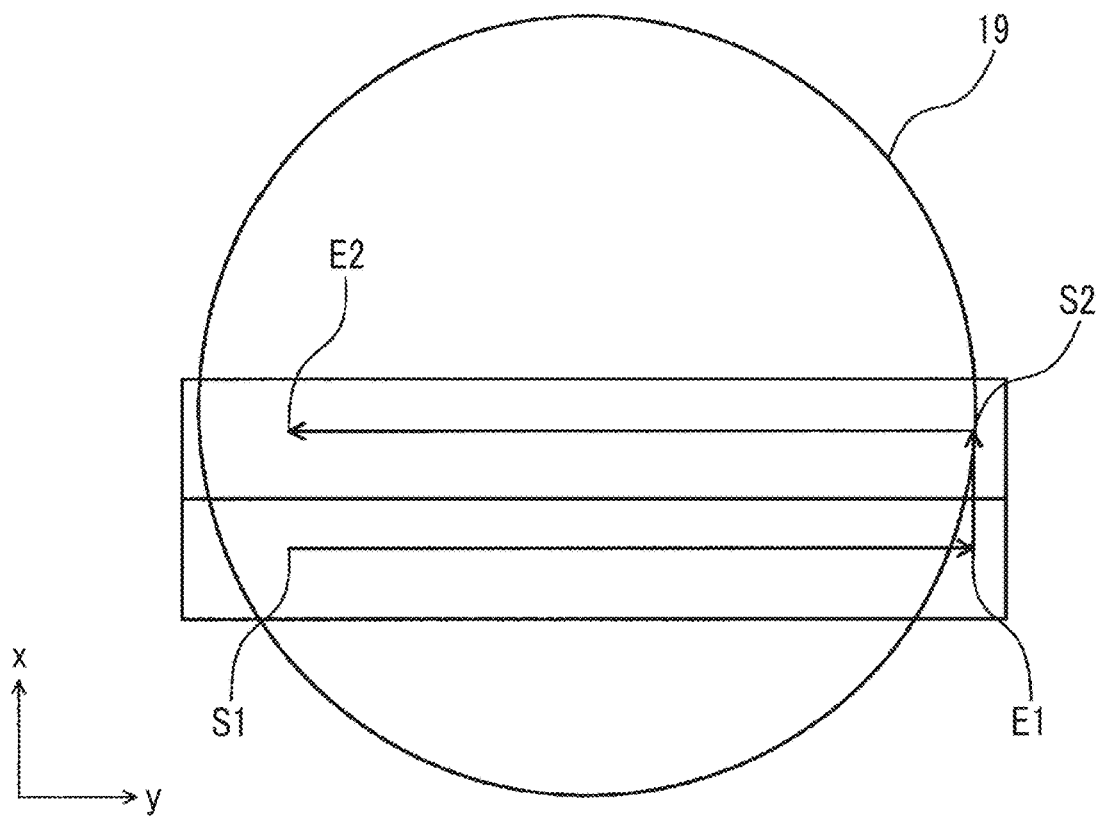
FIG. 7A is a top view showing an irradiation image on a semiconductor wafer in the laser annealing method according to the embodiment (first).
Figure 7B:
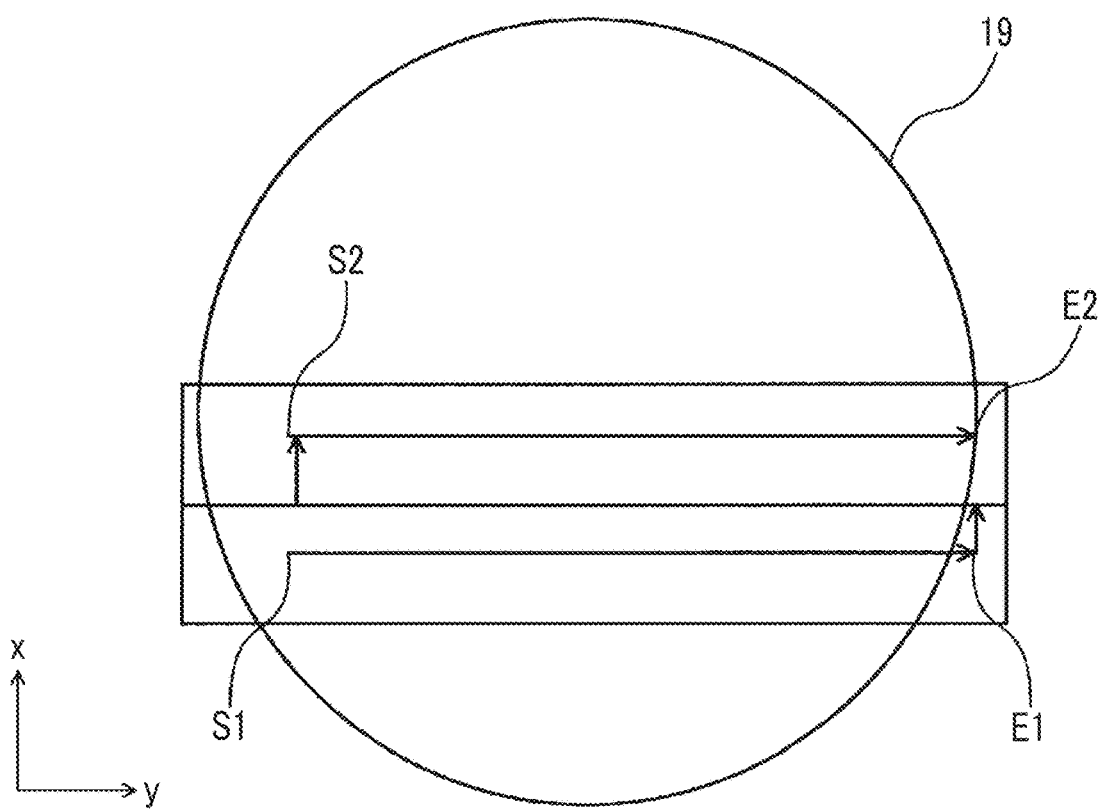
FIG. 7B is a top view showing an irradiation image on the semiconductor wafer in the laser annealing method according to the embodiment (second).

Here, FIGS. 7A and 7B are top views showing irradiation images on the semiconductor wafer in the laser annealing method according to the embodiment. In FIG. 7A, as illustrated in FIGS. 4 and 5, laser irradiation is started from a start point S1, and the laser moves in the scan direction (y-axis direction). When the laser reaches an end portion E1, the laser moves only in the step direction (x-axis direction), laser irradiation is started from a start point S2, and the laser moves in the scan direction. When the laser reaches an end portion E2, the laser moves only in the step direction. The end portion is the end portion of the semiconductor wafer 19, and corresponds to, for example, the (0,7) region and the (1,7) region in FIG. 4. As described above, in FIG. 7A, since the movement at the end portions E1 and E2 is only in the step direction, the movement time of the laser irradiation is short, and the time for irradiating the entire surface of the semiconductor wafer with the laser can be reduced.

On the other hand, in FIG. 7B, the laser irradiation is started from a start point S1, the laser moves in the scan direction (y-axis direction). When the laser reaches an end portion E1, the laser moves in the step direction (x-axis direction) and the scan direction, and laser irradiation is started from a start point S2. Thereafter, the laser moves in the scan direction, and when the laser reaches an end portion E2, the laser moves in the step direction and the scan direction. As described above, in FIG. 7B, since the movement at the end portions E1 and E2 is in the scan direction, an interval is provided between the regions continuously irradiated with the laser even at the end portions, so that the increased heat of the semiconductor wafer can be decreased even at the end portions.

Returning to FIG. 3, the method of manufacturing the semiconductor device will be described. Next, an ion implantation process of forming a p$^+$-type collector region 16 on the back surface 15 side of the semiconductor wafer by photolithography and implantation of p-type ions such as boron (B) is performed (step S6).

Next, a process of creating a mask pattern having an opening in the FWD region 13 is performed by photolithography (step S7). Next, an ion implantation process of forming an n$^+$-type cathode region 17 by changing a corresponding part into an n$^+$-type by implanting n-type ions such as phosphorus (P) is performed (step S8). Next, a process of removing the mask pattern is performed (step S9).

Next, a Green laser annealing process of activating the ions implanted into the p$^+$-type collector region 16 and the n$^+$-type cathode region 17 is performed (step S10) Next, a process of removing the protective film 11 is performed (step S11). Next, a back surface electrode 7 is formed on the entire back surface 15 of the semiconductor wafer (step S12). The back surface electrode 7 is in contact with the p$^+$-type collector region 16 and the n$^+$-type cathode region 17. The back surface electrode 7 functions as a collector electrode and also as a cathode electrode. Thereafter, the RC-IGBT chip (semiconductor chip) is completed by cutting (dicing) the semiconductor wafer into individual pieces.

As described above, according to the laser annealing method for a semiconductor device and the semiconductor device according to the embodiment, the overlap ratio is set to be less than 0%. Accordingly, there is a time interval between the irradiation of a certain region with the laser and the irradiation of the adjacent region with the laser, and there is a time for the increased heat of a semiconductor wafer to decrease. Therefore, heat generation on the non-irradiated surface side can be suppressed. Therefore, when a deep region is activated by IR laser annealing, the semiconductor device does not become defective without damaging the protective film.

EXAMPLES

Hereinafter, examples will be described. FIG. 8 is a table showing the overlap ratios and the evaluation results of examples and a comparative example. In the examples, evaluation was performed by changing the overlap ratio and the conditions of an IR laser. In the comparative example, evaluation was performed at an overlap ratio of 67%/50% in the related art. In FIG. 8, OL ratio indicates the overlap ratio, and Number of shots is the number of laser pulses irradiating one region of a semiconductor wafer. Energy density, Pulse width, and Frequency are the conditions of the IR laser, and the units thereof are J/cm$^2$, μs, and kHz, respectively. Pulse width corresponds to the pulse width t2 in FIG. 6, and Frequency is the number of laser pulses per second. That is, Frequency is the reciprocal of the interval t1 in FIG. 6.

An activation ratio indicates a ratio at which ions implanted into an FS layer are activated in a case where the ratio is set to 1 in an example of the related art. Peeling indicates whether or not a resist used as a protective film can be peeled off after IR laser annealing. In a case where the resist used as the protective film is damaged by heat, the resist is burned on the surface of a semiconductor device (semiconductor wafer), or the resist is transferred to a stage to which the semiconductor wafer is fixed during laser annealing. The evaluation result is acceptable in a case where there is no resist burning or transfer, and unacceptable in a case where there is resist burning or transfer.

As shown in FIG. 8, in the comparative example in which the overlap ratio was 67%/50% and in Example 1 in which the overlap ratio in the step direction was 0% and the overlap ratio in the scan direction was negative, there was resist burning or transfer, so that the evaluation result was unacceptable. Furthermore, in any of Examples 2 to 5 in which the overlap ratio in the step direction was positive and the overlap ratio in the scan direction was negative, burning or transfer of the resist had not occurred, and the evaluation result was acceptable. In Examples 2 to 6, the activation ratio was 0.95 to 1.00, and it can be seen that the ions implanted into the FS layer were sufficiently activated even with a negative overlap.

Figure 9:
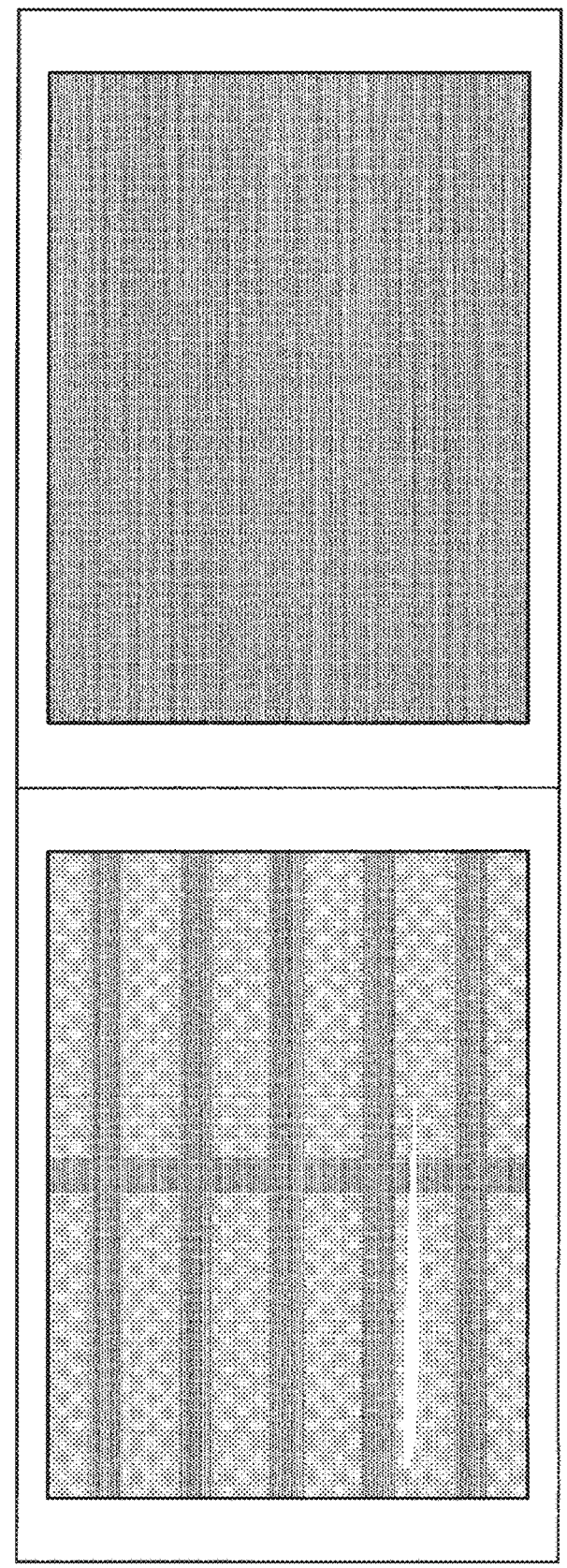
FIG. 9 is a top view showing a resist state after laser irradiation by the laser annealing method according to the example.

FIG. 9 is a top view showing a resist state after laser irradiation by the laser annealing method according to the example. This figure shows the results after performing the laser annealing method with an energy density of the IR laser of 7.5 J/cm$^2$, an overlap ratio of −50%/50%, and a pulse width of 20 us and a frequency of 1 kHz of the IR laser.

In FIG. 9, the lower figure shows the resist state at a magnification of 5 times, and the upper figure shows the resist state at a magnification of 50 times. As shown in FIG. 9, in the laser annealing method according to the example, the temperature of a surface protective film on a non-irradiated surface does not exceed the heat resistant temperature of the protective film, so that the protective film is not damaged.

Figure 10:
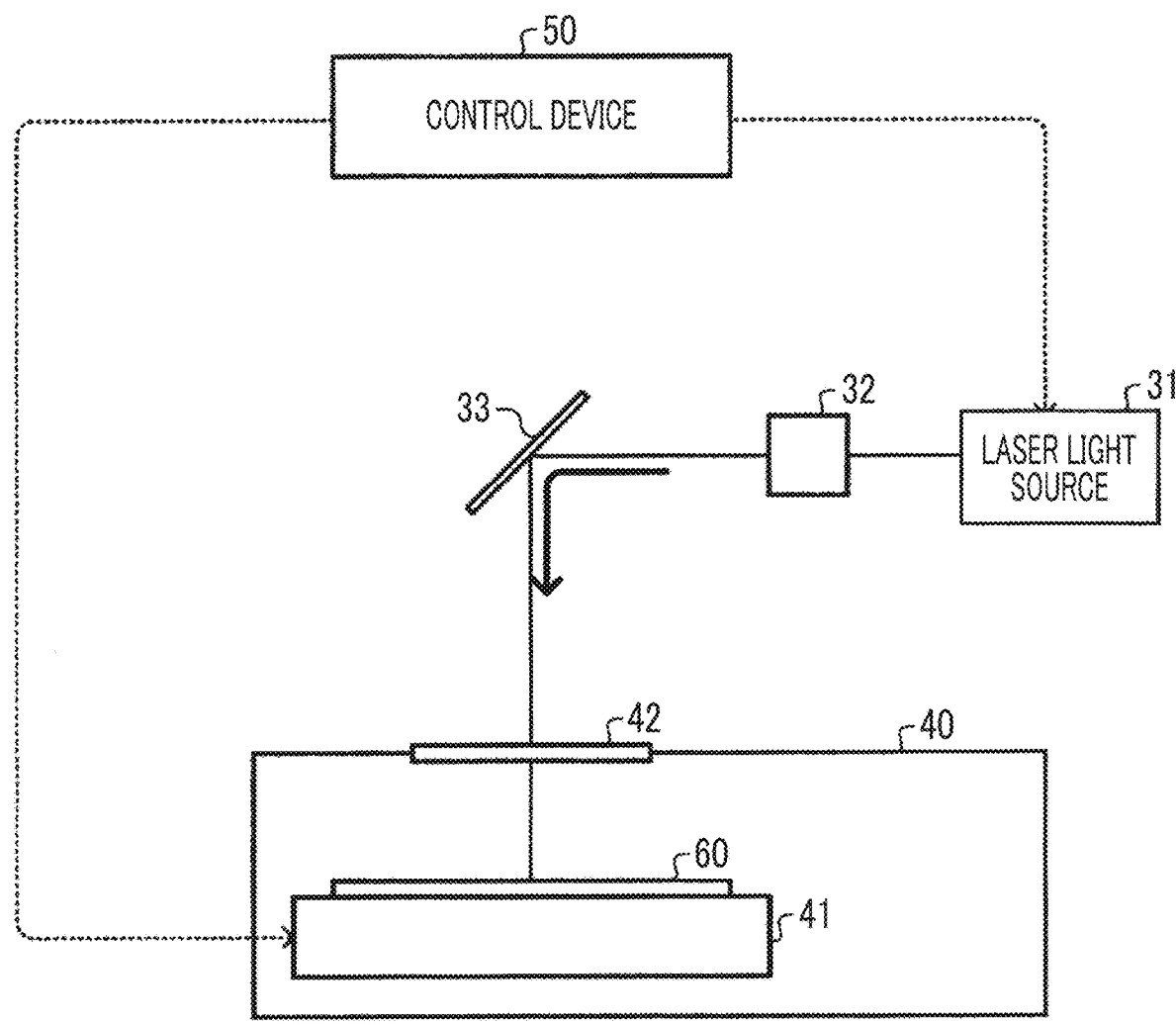
FIG. 10 is a schematic view illustrating a laser annealing apparatus according to the example.

A laser annealing apparatus according to the example will be described with reference to FIG. 10. FIG. 10 is a schematic view of the laser annealing apparatus according to the example. A laser light source 31 outputs a pulsed laser beam for annealing. As the laser light source 31, for example, a semiconductor laser oscillator that outputs a pulsed laser beam in the infrared region can be used. The pulsed laser beam output from the laser light source 31 is incident on an annealing object 60 via a beam homogenizer 32 and a mirror 33. The annealing object 60 is, for example, a semiconductor wafer into which a dopant has been implanted, and activation annealing of the dopant is performed by irradiating a pulsed laser beam.

The beam homogenizer 32 shapes the beam cross-sectional shape and beam profile of the pulsed laser beam on the surface of the annealing object 60. For example, the beam cross section is shaped so that the beam cross section on the surface of the annealing object 60 has an elongated shape that is long in one direction. The beam profile is shaped into a top flat shape, for example, in a length direction and a width direction of the beam cross section.

The annealing object 60 is held on a stage 41 in a chamber 40. For example, the stage 41 holds the annealing object 60 horizontally, and moves the annealing object 60 in a two-dimensional direction on a horizontal plane. As the stage 41, for example, an XY stage having a moving mechanism can be used. The pulsed laser beam is transmitted through a laser transmission window 42 provided in the upper surface of the chamber 40 and is introduced into the chamber 40. By moving the annealing object 60 by the stage 41, the surface of the annealing object 60 can be scanned with the pulsed laser beam.

A control device 50 controls the output of the pulsed laser beam from the laser light source 31 and the movement of the annealing object 60 by the stage 41. The control device 50 reads a signal from an encoder attached to the stage 41 to acquire the position information of the annealing object 60. By outputting one shot of the pulsed laser beam from the laser light source 31 based on the position of the annealing object 60, the pulsed laser beam can be incident on the target position of the annealing object 60.

The control device 50 allows the pulsed laser beam to be output from the laser light source 31 while controlling the stage 41 to move the annealing object 60, such that the pulsed laser beam is incident on the target position. Accordingly, the region on which the pulsed laser beam is incident moves on the surface of the annealing object 60 for each shot. The control device 50 has a function of realizing each process of the laser annealing method described with reference to FIGS. 11A to 13E.

Next, a scanning path on the surface of the annealing object 60 will be described with reference to FIG. 11A.

Figure 11A:
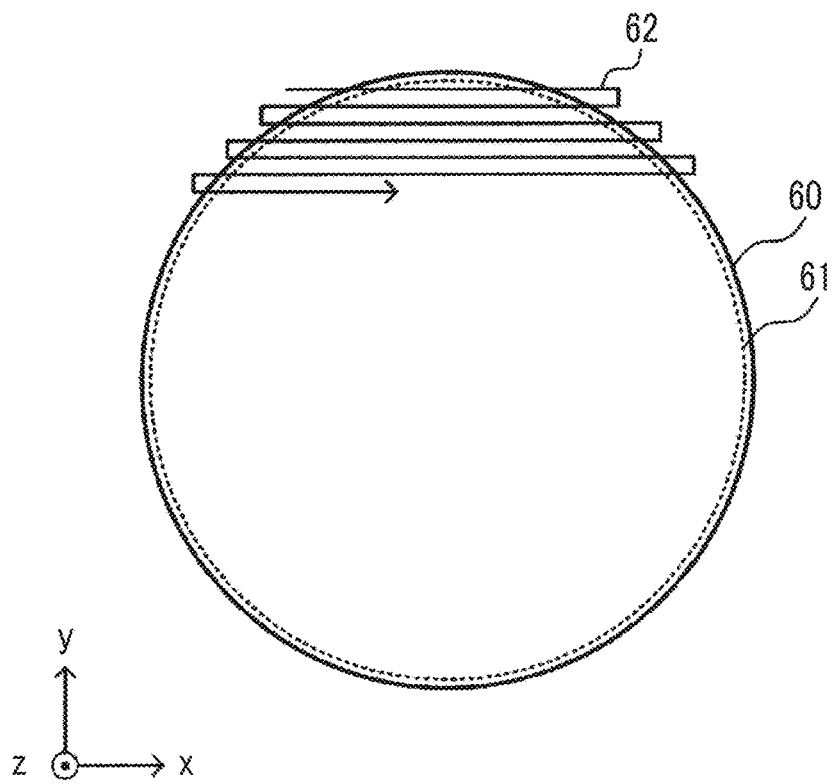
FIG. 11A is a diagram showing a scanning path when the surface of an annealing object is scanned with a pulsed laser beam.

FIG. 11A is a diagram showing a scanning path 62 of the pulsed laser beam on the surface of the annealing object 60. An xyz orthogonal coordinate system is defined in which the surface of the annealing object 60 is an xy plane and the normal direction of the surface is a z-axis direction. An annealing target region 61 to be annealed is defined on the surface of the annealing object 60, which is substantially circular. The annealing target region 61 includes a region in which a semiconductor element is disposed on the surface of the annealing object 60. For example, a region except for the region in the vicinity of the outer peripheral line of the annealing object 60 is defined as the annealing target region 61.

The annealing target region 61 is scanned with the pulsed laser beam so that the x-axis direction is a main scanning direction and the y-axis direction is a sub-scanning direction.

Figure 11B:
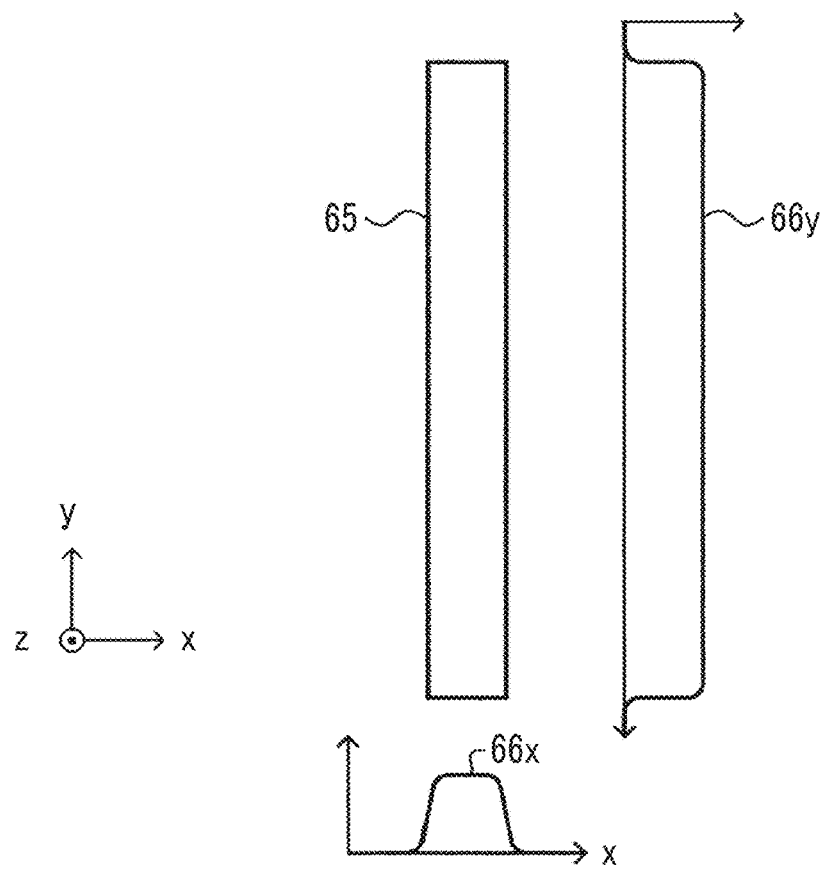
FIG. 11B is a diagram showing a planar shape and a beam profile of a beam cross section.

Next, the shape and beam profile of a beam cross section 65 on the surface of the annealing object 60 will be described with reference to FIG. 11B. FIG. 11B is a diagram showing a planar shape and a beam profile of the beam cross section 65 on the surface of the annealing object 60. The beam cross section 65 has an elongated shape that is long in one direction (y-axis direction). A beam profile $66x$ in the x-axis direction and a beam profile $66y$ in the y-axis direction both have a top flat shape. For example, the beam cross section 65 has a dimension of about 2.5 mm in a length direction (y-axis direction) and a dimension of about 0.3 mm in a width direction (x-axis direction).

Figure 12:
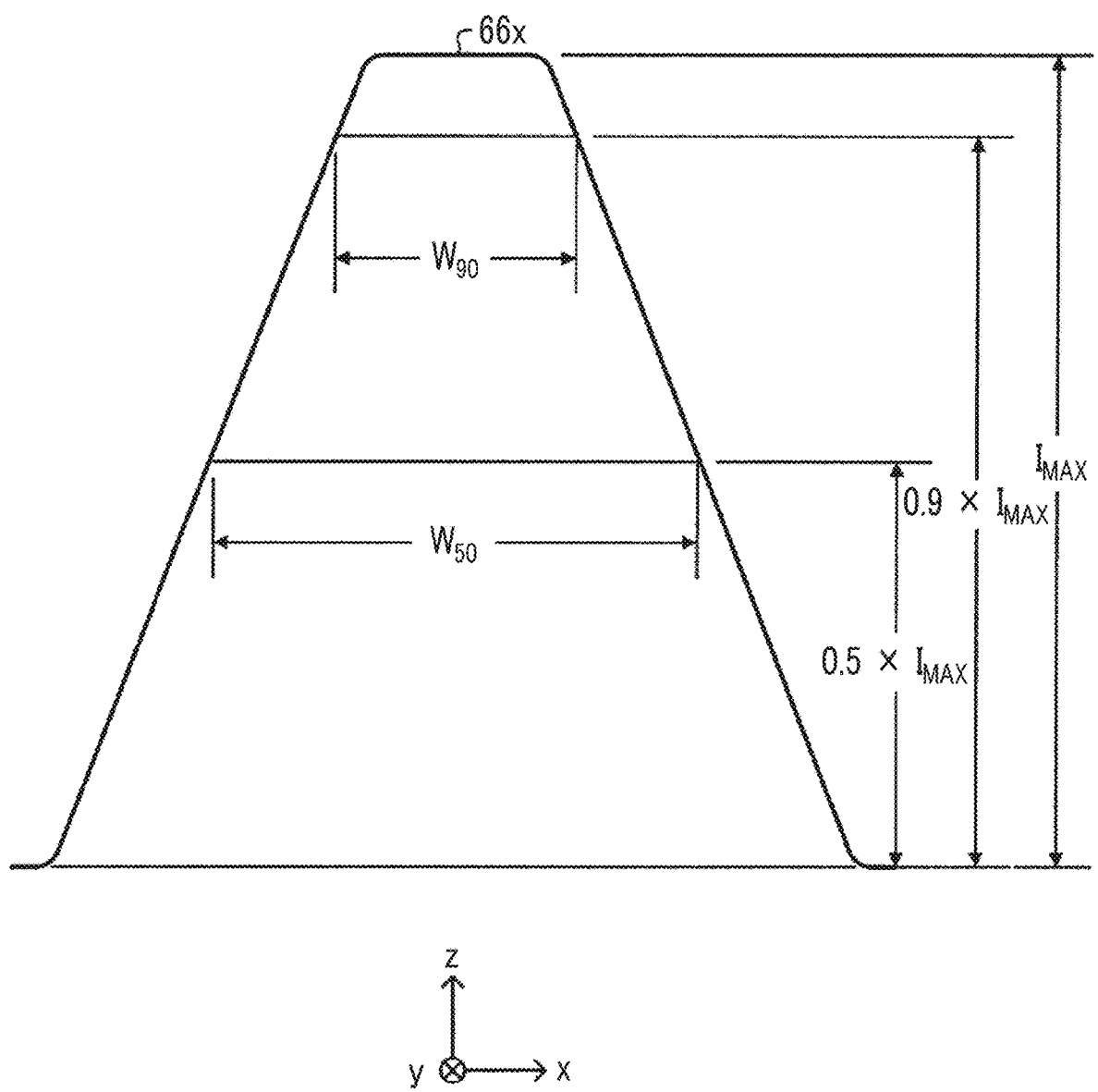
FIG. 12 is a graph showing a beam profile of the beam cross section in a width direction (x-axis direction).

Next, the definition of the size of the beam cross section 65 will be described with reference to FIG. 12. FIG. 12 is a graph showing a beam profile $46x$ of the beam cross section 65 in the width direction (x-axis direction). The horizontal axis of FIG. 12 represents a position in the x-axis direction, and the vertical axis represents a light intensity. The maximum value of the light intensity (maximum height of the beam profile) is indicated as $I_{MAX}$. The shape of the beam profile is approximated by an isosceles trapezoid. The full width at half maximum (FWHM) of the beam profile is indicated as $W_{50}$, and the width (full width at 90%) at the position at which the light intensity is 90% of the maximum value $I_{MAX}$ is indicated as $W_{90}$.

In the present specification, the outer peripheral line of the beam cross section 65 is defined as the position at which the light intensity is 50% of the maximum value $I_{MAX}$. With this definition, the width of the beam cross section 65 is equal to the full width at half maximum $W_{50}$ of the beam profile. In order to perform uniform annealing on the surface of the annealing object 60 (FIG. 11A) in the x-axis direction, it is preferable to scan the surface of the annealing object 60 with the pulsed laser beam so that regions on which the inner part of the full width at 90% $W_{90}$ with little intensity unevenness is incident are arranged without gaps in the x-axis direction or partially overlap to be arranged.

Next, an annealing method according to the example will be described with reference to FIGS. 13A to 13E. In the example, regions on which the pulsed beam is incident on the surface of the annealing object 60 (FIG. 11A) are moved for each shot, and are annealed by irradiating multiple shots of the pulsed laser beam.

FIGS. 13A to 13E are diagrams showing regions 70A to 70E on which the pulsed laser beam is incident by first to fifth main scannings when focusing on each main scanning line, and the distributions of the number of irradiations in the x-axis direction. In the following description, attention will be paid to a process of performing main scanning along one scanning line. Processes of performing the main scanning along the other scanning lines are the same as the process described below. Here, the overlap in the sub-scanning direction (y-axis direction) of the regions 70A to 70E on which the pulsed laser beam is incident is not considered.

Figure 13A:
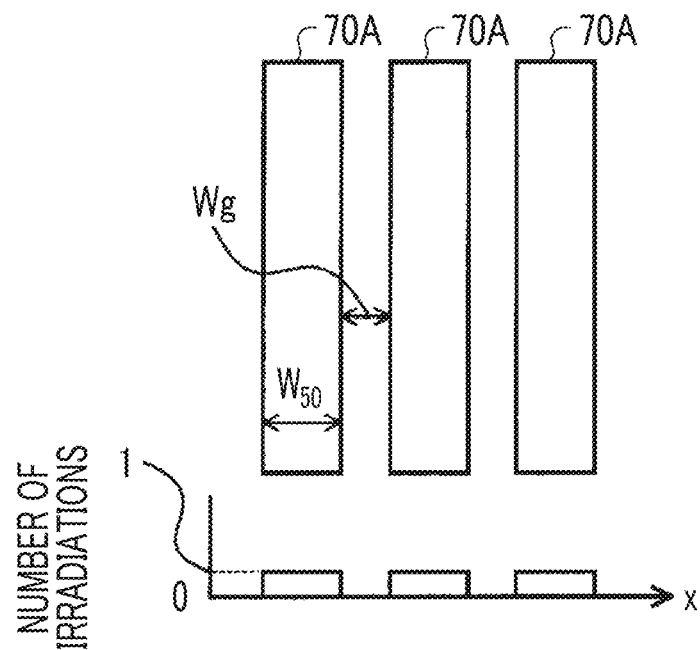
FIG. 13A is a diagram showing regions on which a pulsed laser beam is incident in a first unit step and the distribution of the number of irradiations in the x-axis direction.
Figure 13B:
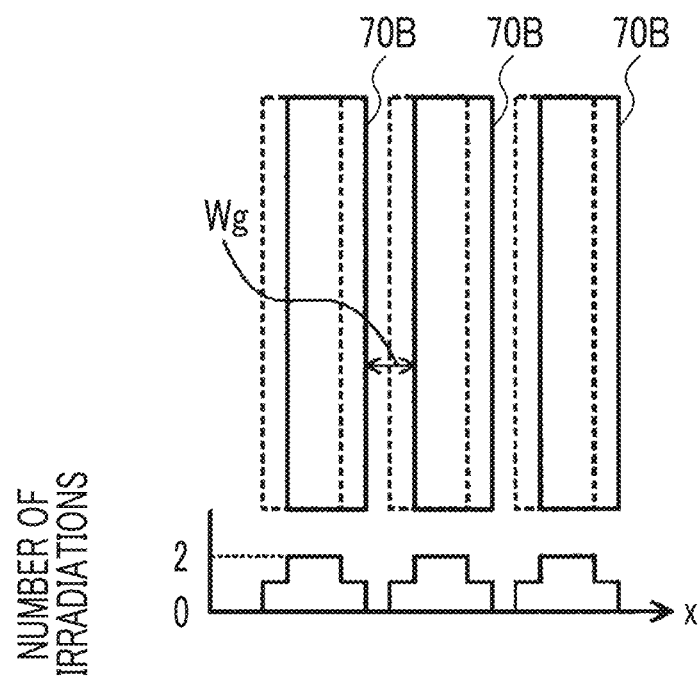
FIG. 13B is a diagram showing regions on which the pulsed laser beam is incident in a second unit step and the distribution of the number of irradiations in the x-axis direction.
Figure 13C:
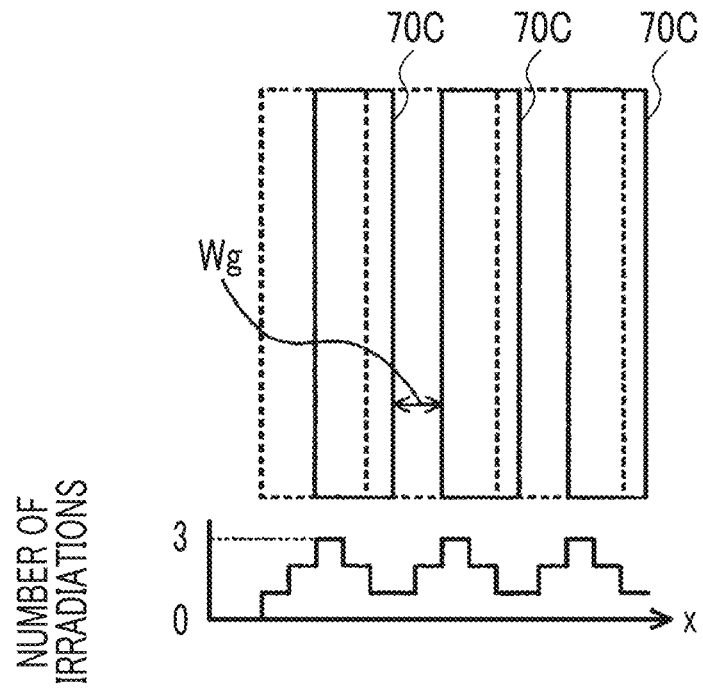
FIG. 13C is a diagram showing regions on which the pulsed laser beam is incident in a third unit step and the distribution of the number of irradiations in the x-axis direction.
Figure 13D:
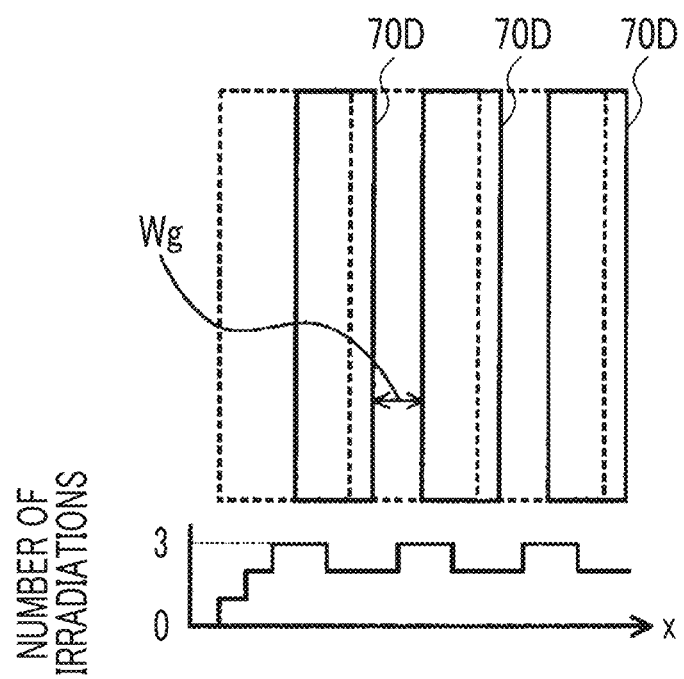
FIG. 13D is a diagram showing regions on which the pulsed laser beam is incident in a fourth unit step and the distribution of the number of irradiations in the x-axis direction.
Figure 13E:
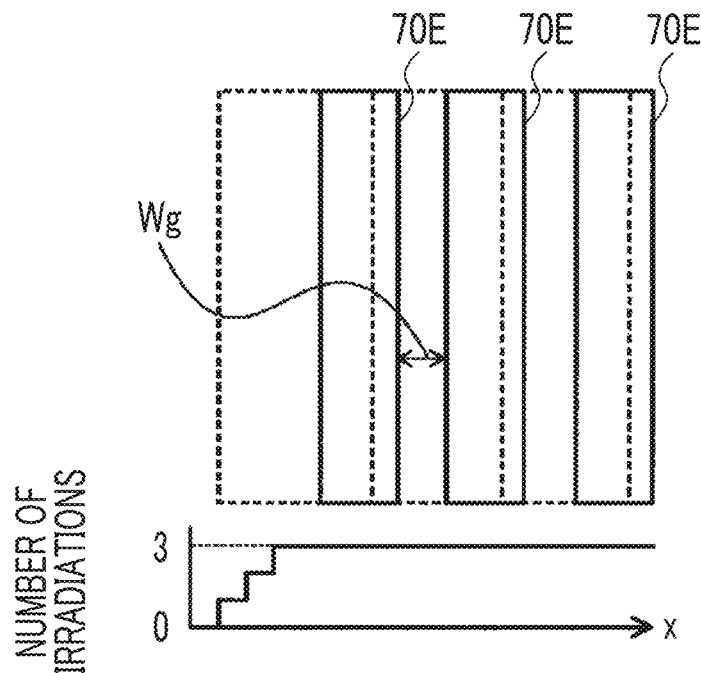
FIG. 13E is a diagram showing regions on which the pulsed laser beam is incident in a fifth unit step and the distribution of the number of irradiations in the x-axis direction.

As shown in FIG. 13A, in the first main scanning, the surface of the annealing object 60 is scanned with the pulsed laser beam in the main scanning direction (x-axis direction)

so that a gap is secured between the regions 70A on which the pulsed laser beam is incident. This scanning is performed so that a plurality of the regions 70A on which the pulsed laser beam is incident are arranged at equal intervals in the x-axis direction. The width Wg of the gap between the two regions 70A adjacent to each other in the x-axis direction is, for example, ⅔ of the width of the beam cross section 65 (full width at half maximum $W_{50}$). By the first main scanning, the number of irradiations of the inside of the regions 70A on which the pulsed laser beam is incident becomes one.

In each of the second to fifth main scannings shown in FIGS. 13B to 13E, the surface of the annealing object 60 is scanned so that a gap is secured between the regions on which the pulsed laser beam is incident, between the shots. As shown in FIGS. 13B to 13E, the regions 70B to 70E on which the pulsed laser beam is incident are formed by the second to fifth main scannings, respectively. In any of the main scannings, the width Wg of the gap between the regions 70B to 70E on which the pulsed laser beam is incident is equal to the width Wg of the gap between the regions 70A on which the pulsed laser beam is incident in the first main scanning.

The regions 70B (FIG. 13B) on which the pulsed laser beam is incident in the second main scanning partially overlap the regions 70A on which the pulsed laser beam is incident in the first main scanning at an overlap ratio of 67% (⅔) in the x-axis direction. In the region where the region 70A and the region 70B overlap, the number of irradiations becomes two. Similarly, the regions 70C (FIG. 13C), 70D (FIG. 13D), and 70E (FIG. 13E) on which the pulsed laser beam is incident in the third to fifth main scannings partially overlap the regions 70B, 70C, and 70D on which the pulsed laser beam is incident in the second to fourth main scannings immediately therebefore at an overlap ratio of 67%.

At the time when the third main scanning (FIG. 13C) is ended, the number of irradiations of the region where the regions 70A to 70C on which the pulsed laser beam is incident in the first to third main scannings overlap becomes three. By the fourth main scanning, the region where the number of irradiations becomes three is expanded, and at the time when the fifth main scanning is ended, the regions where the number of irradiations is three are continuous in the x-axis direction.

Next, excellent effects obtained by the laser annealing method according to the example will be described. When the pulsed laser beam is incident on the annealing object 60 (FIG. 11A), the temperature of the laser-irradiated surface first rises. When the irradiation of one shot is ended, heat conduction occurs in the depth direction from the laser-irradiated surface, so that the temperature of the laser irradiation surface drops sharply and the temperature of a deep layer portion rises. Furthermore, as the heat reaches the back surface of the annealing object 60, the temperature of the back surface rises. In a case where the pulsed laser beam of the next shot is incident on the same region before the temperature of the back surface returns to the temperature before irradiation, the temperature of the back surface further rises due to the influence of heat accumulation.

In the example, since a gap is secured between the regions on which the pulsed laser beam is incident by two continuous shots, the region where the temperature rises due to the previous shot and the region where the temperature rises due to the next shot do not overlap. Therefore, the influence of heat accumulation by the previous shot is unlikely to extend to the incident region of the next shot. The next pulsed laser beam is incident so as to overlap the region on which the pulsed laser beam is incident in one main scanning when the main scanning is ended and the subsequent main scanning is performed. Therefore, the elapsed time until the next pulsed laser beam is incident so as to overlap the region on which one pulsed laser beam is incident becomes long. During this elapsed time, the temperature of the back surface of the annealing object 60 drops. Since the next pulsed laser beam is incident after the temperature of the back surface of the annealing object 60 drops to some extent, the temperature rise of the back surface can be suppressed.

Furthermore, as shown in FIGS. 13A to 13E, by performing five main scannings on one main scanning line, a linear region along one scanning line of the annealing target region 61 (FIG. 11A) can be irradiated three times in total. In addition, the overlap ratio of a region on which the pulsed laser beam is incident in one main scanning to a region on which the pulsed laser beam is incident in the next main scanning is 67%. In the following examples, the ratio of the area of a region where a region on which the pulsed laser beam is incident in one main scanning and a region on which the pulsed laser beam is incident in the next main scanning overlap to the area of the on which the pulsed laser beam is incident in one main scanning is defined as the overlap ratio. When a pulsed laser beam having a beam profile in which full width at 90% $W_{90}$ is ½ or more of the full width at half maximum $W_{50}$ is used, regions on which a part where the light intensity is 90% or more of the maximum value $I_{MAX}$ (a part of the full width at 90% $W_{90}$ in FIG. 12) is incident overlap in the x-axis direction to be arranged. As a result, uniform annealing can be performed in the x-axis direction.

A simulation was performed to confirm the above effect obtained by the laser annealing method according to the example. Hereinafter, the simulation results will be described with reference to FIGS. 14A to 15B.

Figure 14A:
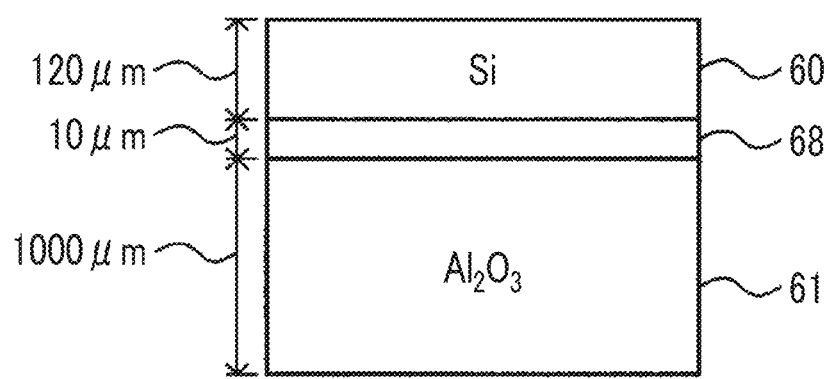
FIG. 14A is a diagram illustrating a cross-sectional structure of an annealing target by a simulation.

FIG. 14A is a diagram illustrating a cross-sectional structure of an annealing target by the simulation. An acrylic protective film 68 is adhered to the back surface of the annealing object 60 made of single crystal silicon. The protective film 68 is adsorbed onto the stage 41 made of alumina ($Al_2O_3$). The thickness of the annealing object 60 was 120 μm, the thickness of the protective film 68 was 10 μm, and the thickness of the stage 41 was 1000 μm. It was assumed that the bottom surface of the stage 41 was maintained at a temperature of 300 K.

The state of temperature rise when a pulsed laser beam was incident on the surface of the annealing object 60 was obtained by the simulation. The simulation was performed on three kinds of laser irradiation of a case where one shot of the pulsed laser beam is incident (a case of one-shot irradiation), a case where two shots of the pulsed laser beam are incident on the same point at a pulse frequency of 1 kHz (a case of two-shot irradiation), and a case where three shots of the pulsed laser beam are incident on the same point at a pulse frequency of 1 kHz (a case of three-shot irradiation). In either case, the pulse energy density on the surface was adjusted so that the maximum temperature reached on the surface of the annealing object 60 reached about 1680 K.

In the present example, continuous shots of the pulsed laser beam are not repeatedly incident on the same region, and therefore, the present example corresponds to the case of one-shot irradiation in the simulation. In a case of scanning the surface of the annealing object 60 at an overlap ratio of 50%, two continuous shots of the pulsed laser beam are incident on the same point. Therefore, the annealing method of scanning at an overlap ratio of 50% corresponds to the case of two-shot irradiation in the simulation. A method of scanning the surface of the annealing object 60 at an overlap ratio of 67% corresponds to the case of three-shot irradiation in the simulation.

Figure 14B:
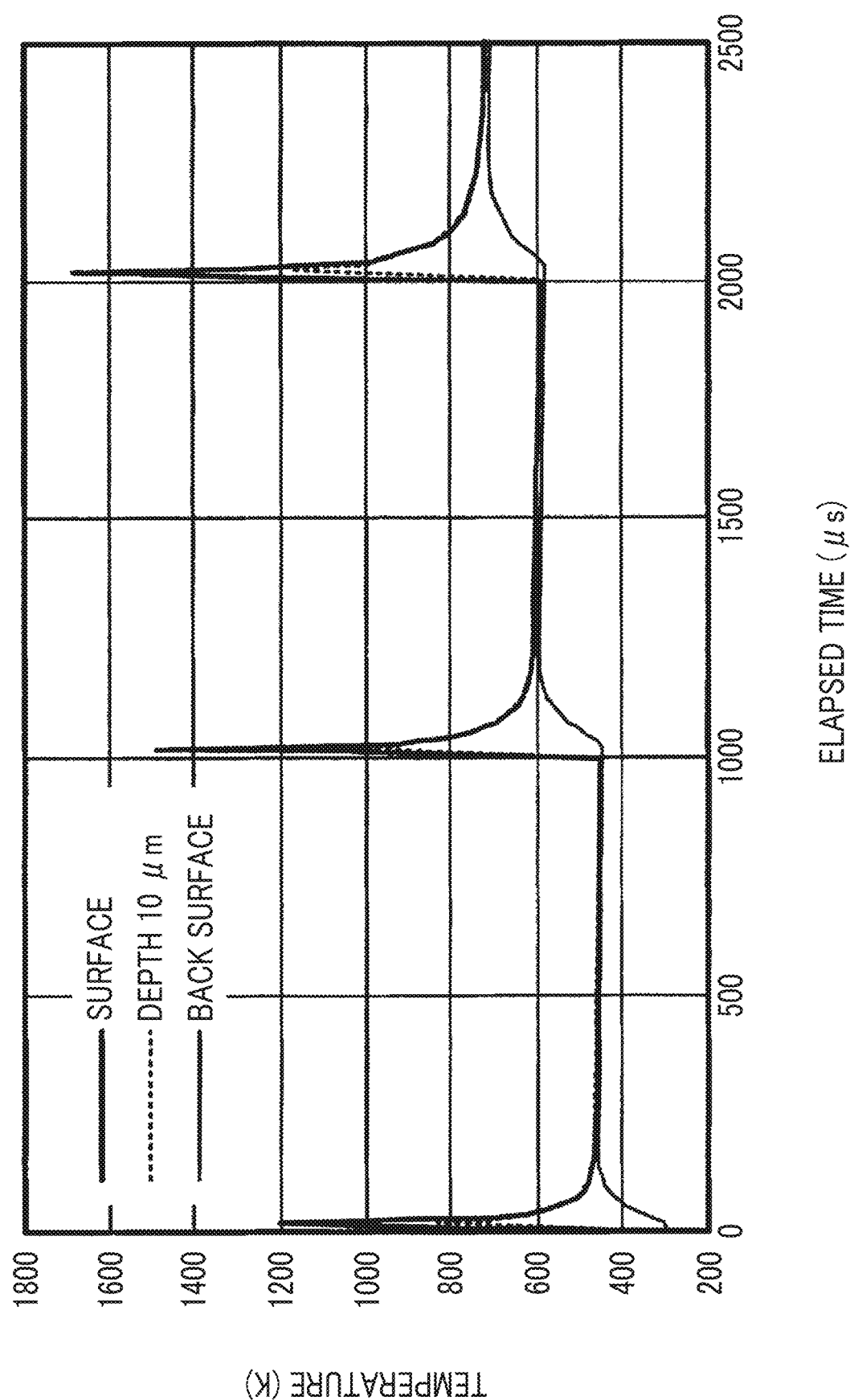
FIG. 14B is a graph showing a change in temperature in a case of three-shot irradiation over time.

FIG. 14B is a graph showing a change in temperature in the case of three-shot irradiation over time. The horizontal axis represents the elapsed time from the time when the first shot of the pulsed laser beam is incident in units of "μs", and the vertical axis represents the temperature in units of "K". The thick solid line in FIG. 14B indicates a change in the temperature on the surface, the broken line indicates a change in the temperature at a position of 10 μm in depth, and the thin solid line indicates a change in temperature on the back surface.

The temperature of the surface rises sharply due to the incidence of the pulsed laser beam, but the temperature of the back surface rises slowly due to heat conduction from the surface. When the laser pulse falls, the surface temperature drops sharply. As about 200 μs has elapsed after the incidence of one shot of the pulsed laser beam, the temperature becomes almost uniform from the surface to the back surface. Thereafter, the overall temperature of the annealing object 60 gradually decreases toward 300 K. In a case where a pulsed laser beam having a pulse frequency of 1 kHz is incident, the elapsed time from the previous shot to the next shot is about 1000 μs. A temperature drop until the next shot of the pulsed laser beam is incident is very slight, and the temperature is kept substantially constant for a period of 1000 μs. Therefore, the next shot is incident while the heat is accumulated in the annealing object 60, and the temperature which is the base of the annealing object 60 rises each time one shot of the pulsed laser beam is irradiated. That is, the temperature of the back surface of the annealing object 60 also gradually rises.

FIG. 15A is a chart showing the simulation results of the maximum temperature reached at positions of the surface (depth 0 μm), depths of 1 μm, 2 μm, 3 μm, 4 μm, 5 μm, and 10 μm, and the back surface (depth 120 μm) of the annealing object 60. The pulse energy densities in the case of one-shot irradiation, two-shot irradiation, and three-shot irradiation were 6.8 J/cm², 5.7 J/cm², and 5.1 J/cm², respectively. Under these conditions, the maximum temperature reached on the surface of the annealing object 60 becomes about 1680 K. It can be seen that the maximum temperature reached decreases as the surface of the annealing object 60 becomes deeper.

Figure 15B:
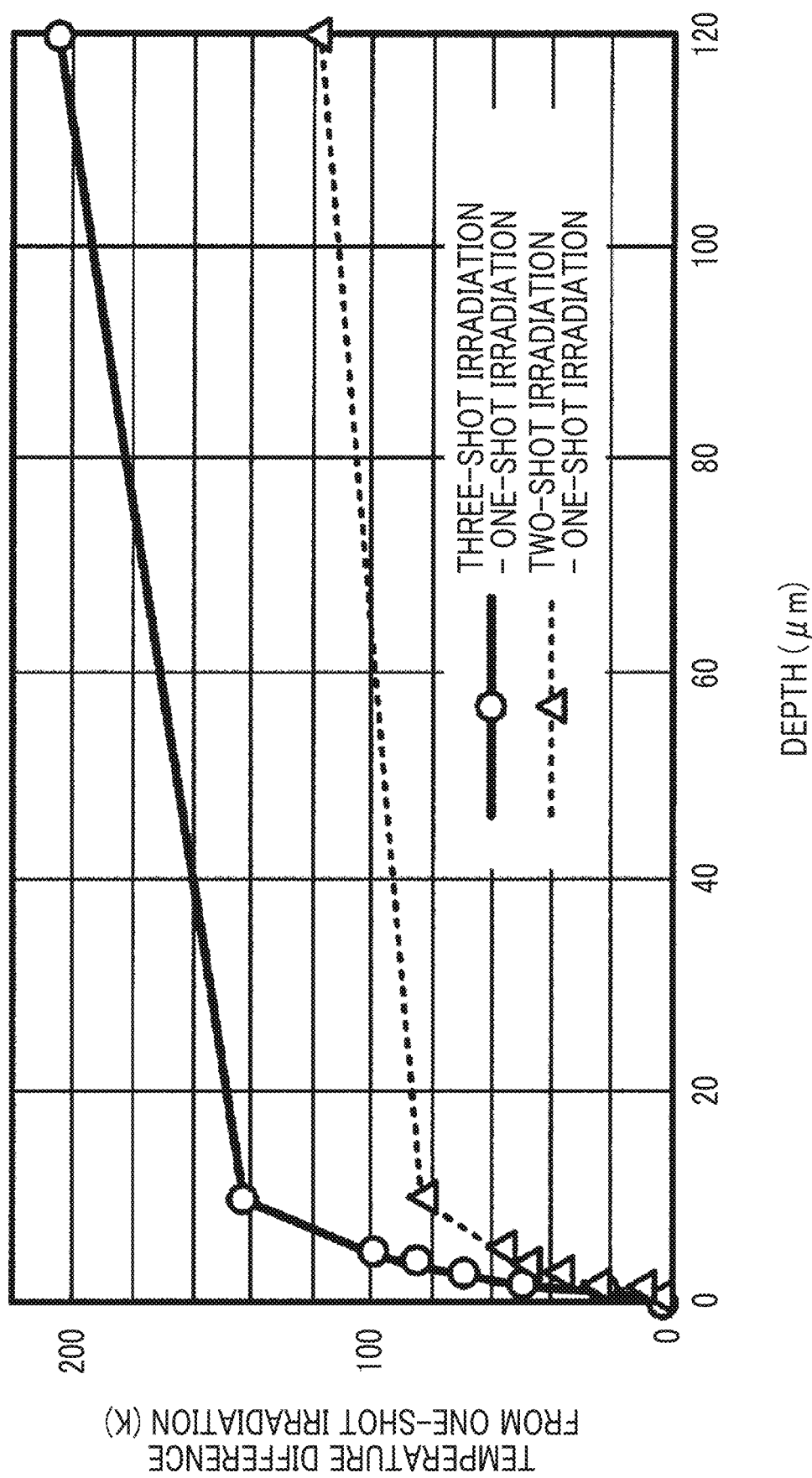
FIG. 15B is a graph showing the difference between the maximum temperature reached in a case of one-shot irradiation and the maximum temperature reached in a case of multiple-shot irradiation.
Figure 16A:
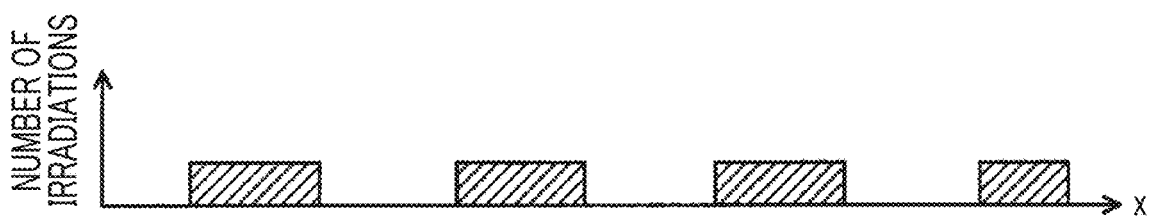
FIG. 16A is a graph showing the distribution of the number of irradiations in an x-axis direction before and after first main scanning (unit step) in an annealing method according to another example.
Figure 16B:
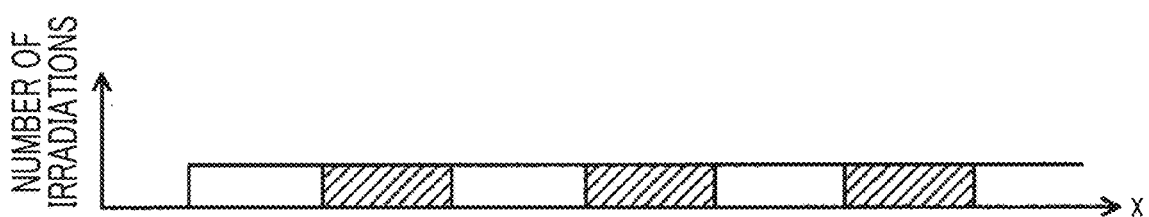
FIG. 16B is a graph showing the distribution of the number of irradiations in the x-axis direction before and after second main scanning (unit step) in the annealing method according to the another example.
Figure 16C:
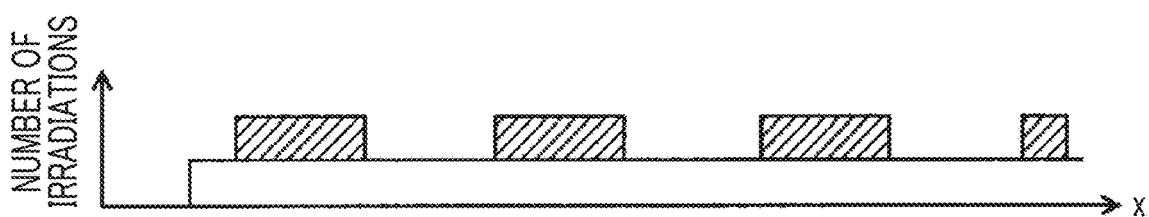
FIG. 16C is a graph showing the distribution of the number of irradiations in the x-axis direction before and after third main scanning (unit step) in the annealing method according to the another example.
Figure 16D:
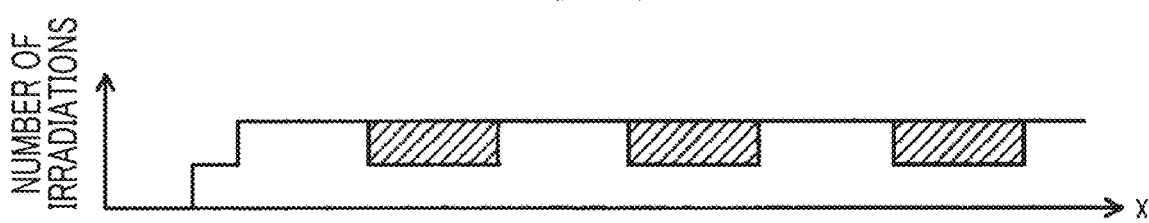
FIG. 16D is a graph showing the distribution of the number of irradiations in the x-axis direction before and after fourth main scanning (unit step) in the annealing method according to the another example.
Figure 16E:
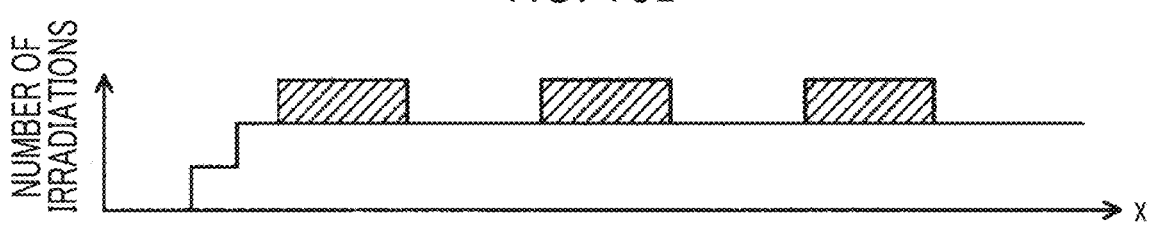
FIG. 16E is a graph showing the distribution of the number of irradiations in the x-axis direction before and after fifth main scanning (unit step) in the annealing method according to the another example.
Figure 16F:
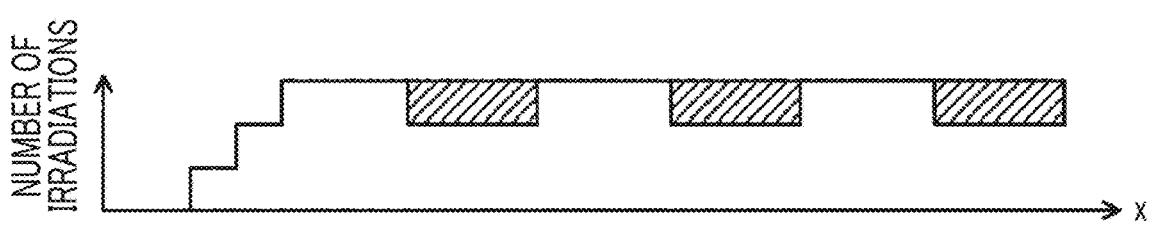
FIG. 16F is a graph showing the distribution of the number of irradiations in the x-axis direction before and after sixth main scanning (unit step) in the annealing method according to the another example.

FIG. 15B is a graph showing the difference between the maximum temperature reached in the case of one-shot irradiation and the maximum temperature reached in the case of multiple-shot irradiation. The second and bottom rows from the bottom of the chart of FIG. 15A also numerically show the difference between the maximum temperature reached in the case of one-shot irradiation and the maximum temperature reached in the case of multiple-shot irradiation. The horizontal axis of FIG. 15B represents the depth of the annealing object 60 in units of "μm", and the vertical axis represents the difference between the maximum temperature reached in the case of one-shot irradiation and the maximum temperature reached in the case of multiple-shot irradiation in units of "K". The temperature difference when the maximum temperature reached in the case of multiple-shot irradiation was higher than the maximum temperature reached in the case of one-shot irradiation was defined as positive. The circle symbols in the graph of FIG. 15B indicate the difference between the maximum temperature reached in the case of one-shot irradiation and the maximum temperature reached in the case of two-shot irradiation, and the triangle symbols indicate the difference between the maximum temperature reached in the case of one-shot irradiation and the maximum temperature reached in the case of three-shot irradiation.

In a region shallower than a depth of 3 μm, the difference in maximum temperature reached is at most 70 K between the case of one-shot irradiation and the case of multiple-shot irradiation. On the other hand, on the back surface, the difference in maximum temperature reached between the case of one-shot irradiation and the case of two-shot irradiation exceeds 100 K, and the difference in maximum temperature reached between the case of one-shot irradiation and the case of three-shot irradiation exceeds 200 K. As can be seen from the simulation results, even in the case of one-shot irradiation (corresponding to the present example), a sufficient annealing effect can be obtained in a very shallow region compared to the case of multiple-shot irradiation, and it is possible to lower the maximum temperature reached on the back surface.

Next, a laser annealing method according to a modification example of the example will be described. In the above example, as shown in FIGS. 13A to 13E, the overlap ratio between the region on which the pulsed laser beam is incident in the previous main scanning and the region on which the pulsed laser beam is incident in the next main scanning is 67% (⅔), but other overlap ratios may be used. For example, the overlap ratio between the region on which the pulsed laser beam is incident in the previous main scanning and the region on which the pulsed laser beam is incident in the next main scanning may be 50%. In addition, the calculation of the overlap ratio between regions on which the pulsed laser beam was incident in the two different main scannings may be performed based on a region on which the pulsed laser beam is incident in main scanning before the previous main scanning instead of the region on which the pulsed laser beam is incident in the previous main scanning. For example, the order of the five main scannings performed from FIGS. 13A to 13E may be changed.

In order to perform uniform annealing in the x-axis direction, it is preferable that at the time when all the main scannings are ended, the regions on which the inner part of the full width at 90% $W_{90}$ (FIG. 12) of the beam profile is incident are arranged without gaps in the x-axis direction or to partially overlap.

In the above example, in each of the main scannings, the region on which the pulsed laser beam is incident is moved at equal intervals in the x-axis direction for each shot, but may also be moved at unequal intervals. Even in a case of moving at unequal intervals, at the time when all the main scannings are ended, the regions on which the inner part of the full width at 90% $W_{90}$ of the beam profile is incident may be arranged without gaps in the x-axis direction or to partially overlap.

In the above example and the modification example, the regions on which the pulsed laser beam is incident do not overlap between the shots in one main scanning. In the present specification, a process of scanning the surface of the annealing object with the pulsed laser beam so that the regions on which the pulsed laser beam is incident do not overlap between the shots is referred to as a "unit step". The unit step is not limited to one main scanning. For example, in a case where main scanning and sub-scanning scan are repeated so that the regions on which the pulsed laser beam is incident do not overlap, a process of repeating the main scanning and the sub-scanning can be referred to as one unit step.

A start point and an end point to be scanned in one unit step may be randomly set. For example, one annealing target region 61 may be divided in the y-axis direction to define a plurality of sections, and the unit step may be repeated for each section.

Next, a laser annealing method according to another example will be described with reference to FIGS. 16A to 16F. Hereinafter, the description of the configuration common to the laser annealing method according to the example shown in FIGS. 10 to 15B will be omitted.

FIGS. 16A to 16F are graphs showing the distributions of the number of irradiations in the x-axis direction before and after first to sixth main scannings (unit steps), respectively. The horizontal axis represents the position in the x-axis direction, and the vertical axis represents the number of irradiations. In each of the graphs of FIGS. 16A to 16F, the number of irradiations before performing the main scanning corresponding to the graph is indicated as a thick solid line, and an increment in the number of irradiations by the main scanning corresponding to the graph is indicated as a hatched region 75. That is, the hatched region 75 indicates a region in the x-axis direction irradiated with the pulsed laser beam by one main scanning corresponding to the graph.

As shown in FIGS. 16A to 16F, in each of the main scannings (unit steps), the surface of the annealing object 60 (FIG. 11A) is scanned so that the regions on which the pulsed laser beam is incident do not overlap each other. In the second main scanning (FIG. 16B), the pulsed laser beam is incident between the regions on which the pulsed laser beam is incident in the first main scanning (FIG. 16A), and both the regions on which the pulsed laser beam is incident do not overlap each other. By the first and second main scannings, the surface of the annealing object 60 is irradiated with the pulsed laser beam completely in the main scanning direction (x-axis direction).

In the third main scanning (FIG. 16C), the surface of the annealing object 60 is scanned so that the overlap ratio to the region on which the pulsed laser beam is incident in the first main scanning (FIG. 16A) is 67%. Similarly, in the fourth to sixth main scannings (FIGS. 16D to 16F), the surface of the annealing object 60 is scanned so that the overlap ratio to the region on which the pulsed laser beam is incident in each of the two previous main scannings (FIGS. 16B to 16D) is 67%.

As in the example shown in FIGS. 16A to 16F, the regions on which the pulsed laser beam is incident may not overlap in two continuous main scannings (for example, the first and second main scannings).

Next, a laser annealing method according to still another example will be described with reference to FIGS. 17A to 17H. Hereinafter, the description of the configuration common to the laser annealing method according to the example shown in FIGS. 10 to 15B will be omitted.

FIGS. 17A to 17H are graphs showing the distributions of the number of irradiations in the x-axis direction before and after first to eighth main scannings (unit steps), respectively. The horizontal axis represents the position in the x-axis direction, and the vertical axis represents the number of irradiations. In each of the graphs of FIGS. 17A to 17H, the number of irradiations before performing the main scanning corresponding to the graph is indicated as a thick solid line, and an increment in the number of irradiations by the main scanning corresponding to the graph is indicated as a hatched region 75. That is, the hatched region 75 indicates a region in the x-axis direction irradiated with the pulsed laser beam by one main scanning corresponding to the graph.

Figure 17A:
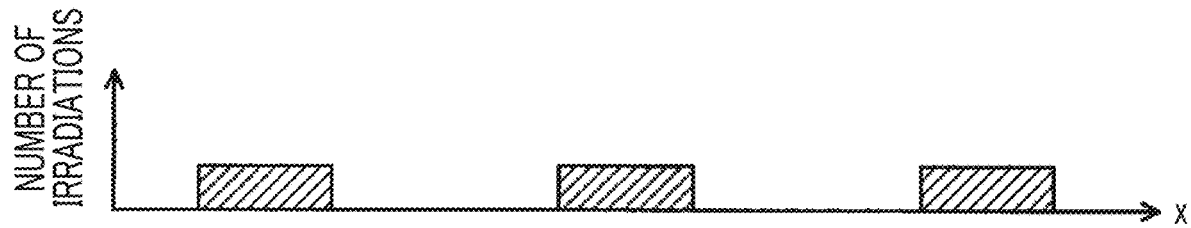
FIG. 17A is a graph showing the distribution of the number of irradiations in the x-axis direction before and after first main scanning (unit step) in an annealing method according to still another example.
Figure 17B:
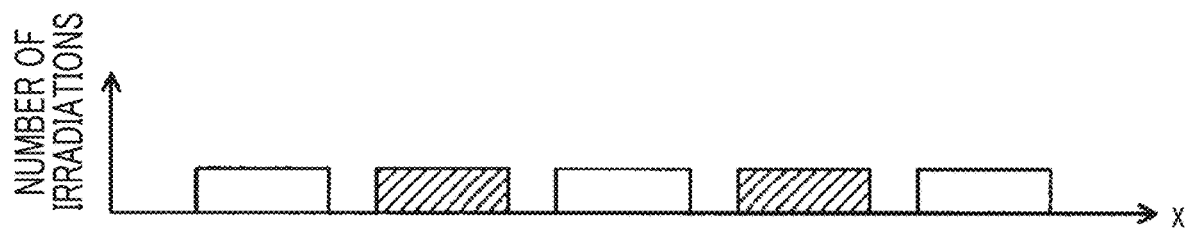
FIG. 17B is a graph showing the distribution of the number of irradiations in the x-axis direction before and after second main scanning (unit step) in the annealing method according to the still another example.
Figure 17C:
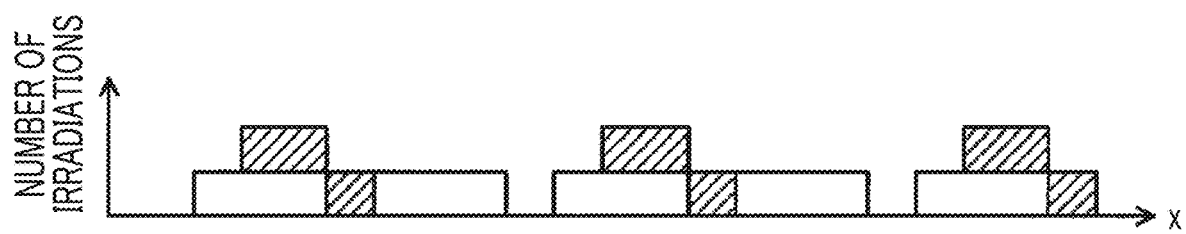
FIG. 17C is a graph showing the distribution of the number of irradiations in the x-axis direction before and after third main scanning (unit step) in the annealing method according to the still another example.
Figure 17D:
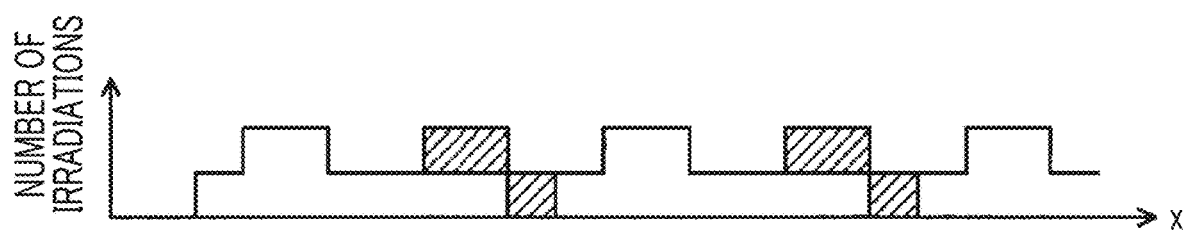
FIG. 17D is a graph showing the distribution of the number of irradiations in the x-axis direction before and after fourth main scanning (unit step) in the annealing method according to the still another example.
Figure 17E:
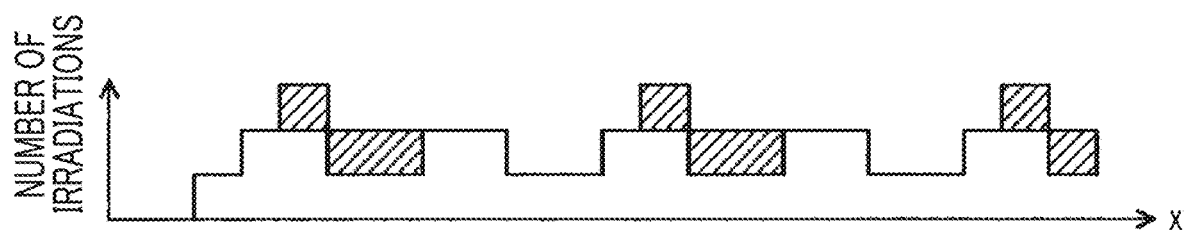
FIG. 17E is a graph showing the distribution of the number of irradiations in the x-axis direction before and after fifth main scanning (unit step) in the annealing method according to the still another example.
Figure 17F:
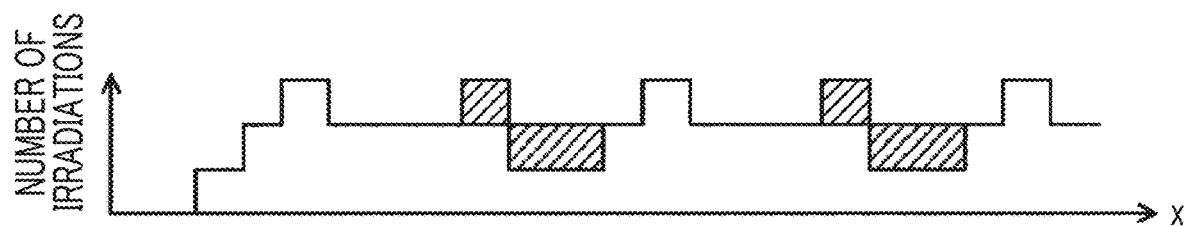
FIG. 17F is a graph showing the distribution of the number of irradiations in the x-axis direction before and after sixth main scanning (unit step) in the annealing method according to the still another example.
Figure 17G:
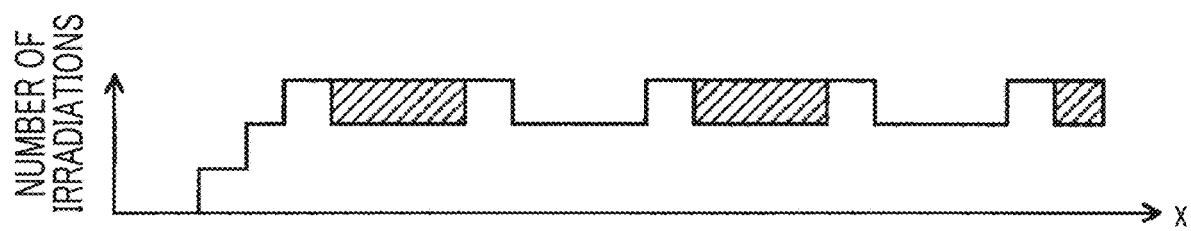
FIG. 17G is a graph showing the distribution of the number of irradiations in the x-axis direction before and after seventh main scanning (unit step) in the annealing method according to the still another example.
Figure 17H:
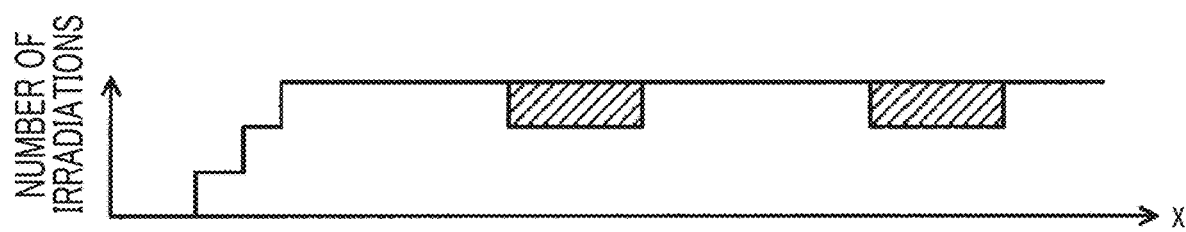
FIG. 17H is a graph showing the distribution of the number of irradiations in the x-axis direction before and after eighth main scanning (unit step) in the annealing method according to the still another example.

As shown in FIGS. 17A to 17H, the interval between regions on which the pulsed laser beam is incident in each of the main scannings is wider than that of the example shown in FIGS. 16A to 16F. Therefore, the regions on which the pulsed laser beam is incident in the second main scanning (FIG. 17B) are separated from the regions on which the pulsed laser beam is incident in the first main scanning (FIG. 17A).

In the third main scanning (FIG. 17C), the surface of the annealing object 60 is scanned so that the overlap ratio to the region on which the pulsed laser beam is incident in the first main scanning (FIG. 17A) is 67%. The region on which the pulsed laser beam is incident in the third main scanning (FIG. 17C) does not overlap the region on which the pulsed laser beam is incident in the second main scanning (FIG. 17B) and is in contact therewith.

Similarly, in the fourth to eighth main scannings (FIGS. 17D to 17H), the surface of the annealing object 60 is scanned so that the overlap ratio to the region on which the pulsed laser beam is incident in each of the two previous main scannings (FIGS. 17B to 17F) is 67%. Further, the regions on which the pulsed laser beam is incident in the fourth to eighth main scannings (FIGS. 17D to 17H) do not overlap the regions on which the pulsed laser beam is incident in the previous main scanning (FIGS. 17C to 17G).

As described above, in each of the main scannings, the region on which the pulsed laser beam is incident may not overlap the region on which the pulsed laser beam is incident in the previous main scanning, but may overlap the region on which the pulsed laser beam is incident in a main scanning before a plurality of times.

Next, an laser annealing method according to still another example will be described with reference to FIGS. 18A to 18C. Hereinafter, the description of the configuration common to the laser annealing method according to the example shown in FIGS. 10 to 15B will be omitted.

Figure 18A:
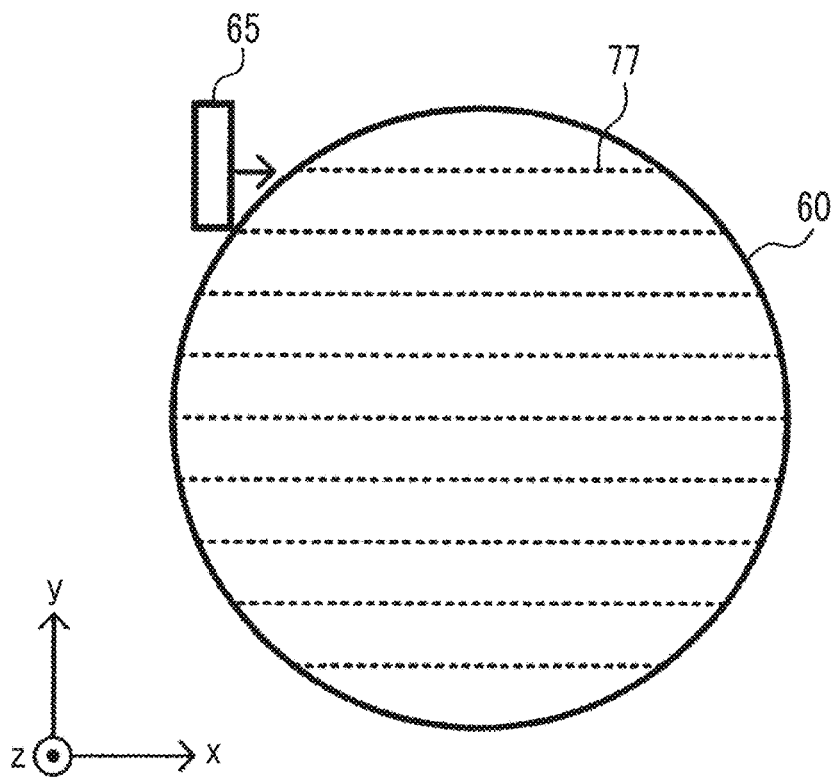
FIG. 18A is a plan view showing scanning lines when an annealing object 60 is scanned by an annealing method according to still another example.

FIG. 18A is a plan view showing scanning lines 77 when the annealing object 60 is scanned. The main scanning direction is parallel to the x-axis. At the time of annealing, the center of the beam cross section 65 of the pulsed laser beam moves so as to follow the scanning lines 77. When the overlap ratio in the sub-scanning direction is 50%, the interval between the scanning lines 77 is ½ of the dimension (length) of the beam cross section 65 in the y-axis direction.

Figure 18B:
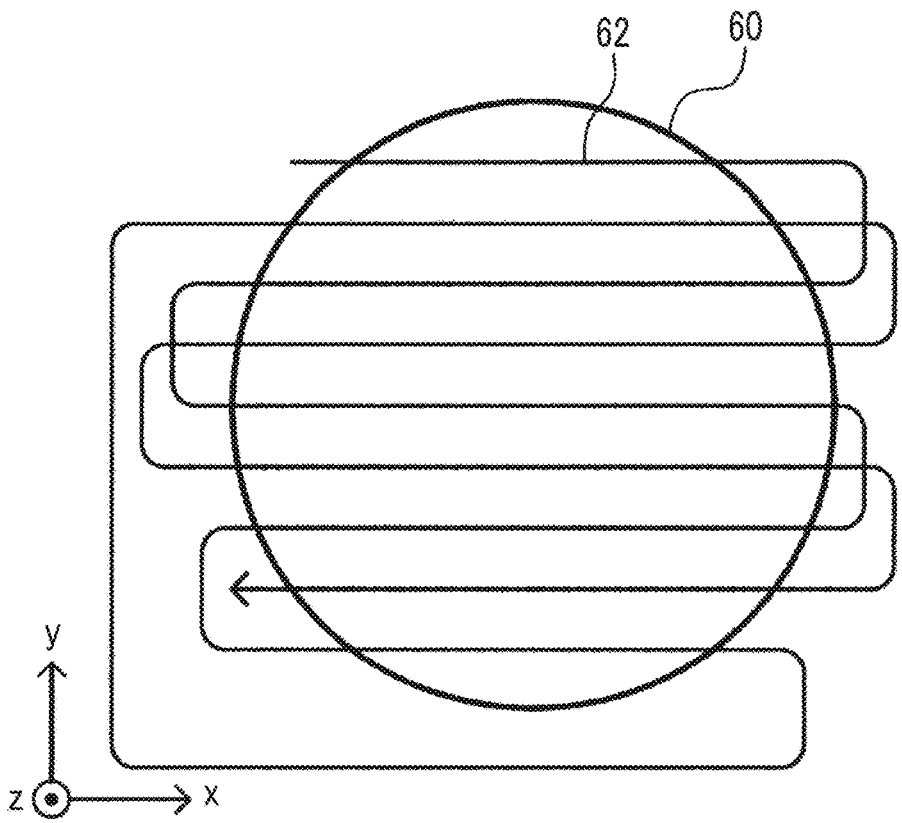
FIG. 18B is a diagram showing an example of a scanning path.

FIG. 18B is a diagram showing an example of the scanning path 62. First, every other scanning line 77 is scanned, and thereafter the remaining scanning lines 77 are scanned in order. At this time, the regions on which the pulsed laser beam is incident in the scanning of one scanning line 77 and the scanning of the subsequently scanned scanning line 77 do not overlap in the y-axis direction. Even during the main scanning, the regions on which the pulsed laser beam is incident do not overlap, as in the example shown in FIGS. 10 to 15B. Therefore, a process of scanning all the scanning lines 77 by following the scanning path 62 shown in FIG. 18B can be referred to as one unit step.

Figure 18C:
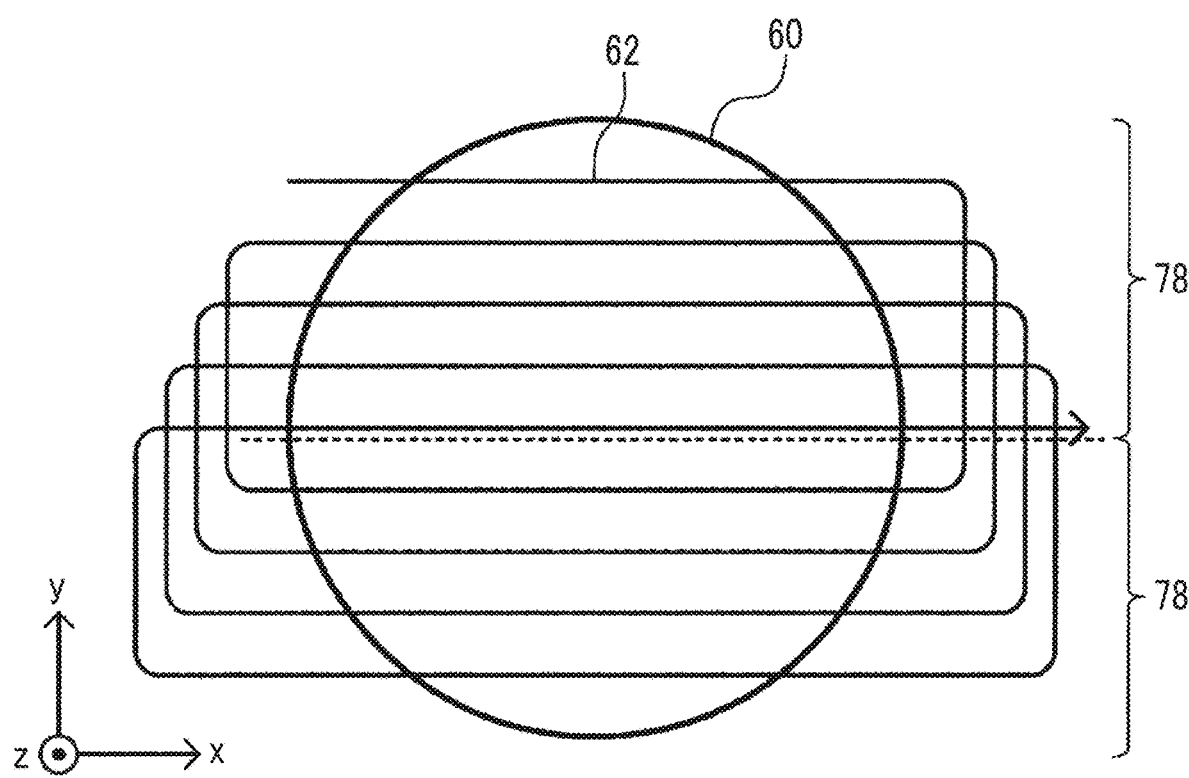
FIG. 18C is a diagram showing another example of the scanning path.
Figure 19:
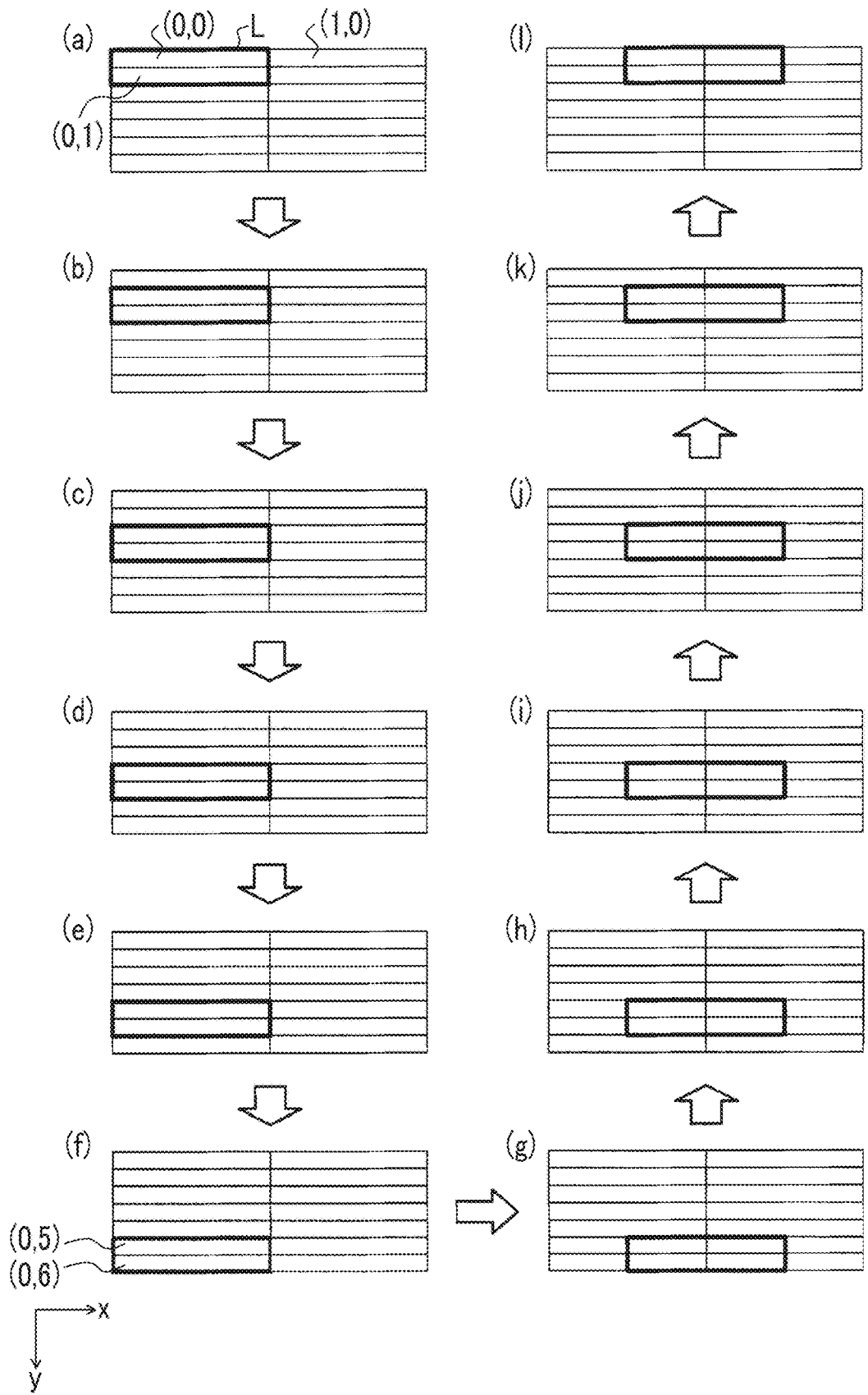
FIG. 19 is a top view illustrating an irradiation image in a laser annealing method in the related art.

FIG. 18C is a diagram showing another example of the scanning path 62. The surface of the annealing object 60 is divided into two partial regions 78. After scanning one scanning line 77 in one partial region 78, one scanning line 77 in the other partial region 78 is scanned. As described above, the scanning lines 77 may be alternately selected from the two partial regions 78, and the selected scanning lines 77 may be scanned in order.

In the example shown in FIGS. 18A to 18C, sub-scanning is performed so that the regions on which the pulsed laser beam is incident do not overlap in the sub-scanning direction. Therefore, it is possible to reduce the thermal effect before and after the sub-scanning.

In the above example, the annealing object 60 is moved with respect to the path of the pulsed laser beam, but the path of the pulsed laser beam may be moved with respect to the annealing object 60. That is, the path of the pulsed laser beam may be shaken in the two-dimensional direction. For example, a scanning mechanism for moving one of the path of the pulsed laser beam and the annealing object 60 with respect to the other may be provided.

It is needless to say that the above-described examples and modification example are examples, and partial substitutions or combinations of the configurations shown in the examples and the modification examples are possible. Similar actions and effects due to the similar configurations of the examples and the modification examples will not be mentioned sequentially for each of the examples. Furthermore, the present invention is not limited to the above-described examples and the modification examples. For example, it will be apparent to those skilled in the art that various modifications, improvements, combinations, and the like can be made.

In the above description, the present invention can be variously modified without departing from the gist of the present invention, and in each of the above-described embodiments, for example, the dimensions of each portion and impurity concentrations are set in various manners according to the required specifications and the like. In each of the embodiments, a first conductive type is an n-type and a second conductive type is a p-type, but the present invention is similarly established even if the first conductive type is the p-type and the second conductive type is the n-type.

As described above, the laser annealing method for a semiconductor device, the semiconductor device, the laser annealing method, the control device of a laser annealing apparatus, and the laser annealing apparatus according to the present invention are useful in the manufacturing of power semiconductor devices used in power conversion devices, power supply devices for various industrial machines, and the like.

It should be understood that the invention is not limited to the above-described embodiment, but may be modified into various forms on the basis of the spirit of the invention. Additionally, the modifications are included in the scope of the invention.

What is claimed is:

1. A laser annealing method for a semiconductor device, comprising:
   a first step of adding an impurity to a semiconductor substrate; and
   a second step of irradiating a region to which the impurity is added with a pulsed laser beam a plurality of times to anneal the semiconductor substrate,
   wherein, in the second step, a first region of a portion of the region to which the impurity is added is irradiated with the pulsed laser beam, and after a predetermined time interval, a second region adjacent to the first region is irradiated with the pulsed laser beam, and
   the predetermined time interval is larger than a pulse interval of the pulsed laser beam.

2. The laser annealing method for a semiconductor device according to claim 1, further comprising:
   a step of forming a protective film on one surface of the semiconductor substrate before the second step,
   wherein, in the second step, the pulsed laser beam is irradiated from a surface opposite to the surface on which the protective film is formed.

3. A laser annealing method for a semiconductor device, comprising:
   a first step of adding an impurity to a semiconductor substrate; and
   a second step of irradiating a region to which the impurity is added with a pulsed laser beam a plurality of times to anneal the semiconductor substrate,
   wherein, in the second step, a first region of a portion of the region to which the impurity is added is irradiated with the pulsed laser beam, and after a predetermined time interval, a second region adjacent to the first region is irradiated with the pulsed laser beam, and
   , in the second step, irradiation regions continuously irradiated with the pulsed laser beam are separated by a predetermined interval or more.

4. The laser annealing method for a semiconductor device according to claim 3,
   wherein the predetermined interval is more than 0% and not more than 100% of a width or height of the irradiation region.

5. The laser annealing method for a semiconductor device according to claim 3,
   wherein the predetermined interval is ½ or ⅔ of a height of the irradiation region or the height of the irradiation region.

6. The laser annealing method for a semiconductor device according to claim 3, further comprising:
   a step of forming a protective film on one surface of the semiconductor substrate before the second step,
   wherein, in the second step, the pulsed laser beam is irradiated from a surface opposite to the surface on which the protective film is formed.

7. A laser annealing method for a semiconductor device, comprising:
   a first step of adding an impurity to a semiconductor substrate;
   a second step of irradiating a region to which the impurity is added with a pulsed laser beam a plurality of times to anneal the semiconductor substrate; and
   a step of forming a protective film on one surface of the semiconductor substrate before the second step,
   wherein, in the second step, a first region of a portion of the region to which the impurity is added is irradiated with the pulsed laser beam, and after a predetermined time interval, a second region adjacent to the first region is irradiated with the pulsed laser beam, and
   in the second step, the pulsed laser beam is irradiated from a surface opposite to the surface on which the protective film is formed.

8. The laser annealing method for a semiconductor device according to claim 7,
   wherein the predetermined interval is more than 0% and not more than 100% of a width or height of the irradiation region.

9. The laser annealing method for a semiconductor device according to claim 7,
   wherein the predetermined interval is ½ or ⅔ of a height of the irradiation region or the height of the irradiation region.

* * * * *